(12) United States Patent
Guarino et al.

(10) Patent No.: US 12,557,686 B2
(45) Date of Patent: Feb. 17, 2026

(54) SEMICONDUCTOR PACKAGE OR DEVICE WITH BARRIER LAYER

(71) Applicant: STMICROELECTRONICS S.r.l., Agrate Brianza (IT)

(72) Inventors: Lucrezia Guarino, Milan (IT); Francesca Milanesi, Milan (IT); Claudio Zafferoni, Vimercate (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 508 days.

(21) Appl. No.: 18/054,806

(22) Filed: Nov. 11, 2022

(65) Prior Publication Data
US 2024/0162175 A1    May 16, 2024

(51) Int. Cl.
*H01L 23/00*    (2006.01)

(52) U.S. Cl.
CPC .............. *H01L 24/05* (2013.01); *H01L 24/03* (2013.01); *H01L 2224/0225* (2013.01);
(Continued)

(58) Field of Classification Search
CPC ....... H01L 21/76807–76813; H01L 21/76841; H01L 21/76871; H01L 21/76877; H01L 21/764; H01L 21/7682; H01L 21/823475; H01L 21/823871; H01L 21/76885; H01L 21/76895; H01L 21/76897; H01L 21/76804; H01L 21/76805; H01L 21/76816; H01L 21/76843–76849; H01L 2221/1015–1036; H01L 2221/1084; H01L 2221/1042–1047; H01L 2224/023–024; H01L 2224/04042; H01L 2224/02125; H01L 23/5226; H01L 23/5283;
(Continued)

(56) References Cited

U.S. PATENT DOCUMENTS 4,688,015 A    8/1987    Kojima et al.
5,525,552 A    6/1996    Huang
(Continued)

FOREIGN PATENT DOCUMENTS

EP          3806145 A1    4/2021
WO    WO 2013025799 A2    2/2013

*Primary Examiner* — Wael M Fahmy
*Assistant Examiner* — Thomas Wilson Mccoy
(74) *Attorney, Agent, or Firm* — Seed IP Law Group LLP

(57) ABSTRACT

The present disclosure is directed to embodiments of a conductive structure on a conductive barrier layer that separates the conductive structure from a conductive layer on which the conductive barrier layer is present. A gap or crevice extends along respective surfaces of the conductive structure and along respective surfaces of one or more insulating layers. The gap or crevice separates the respective surfaces of the one or more insulating layers from the respective surfaces of the conductive structure. The gap or crevice provides clearance in which the conductive structure may expand into when exposed to changes in temperature. For example, when coupling a wire bond to the conductive structure, the conductive structure may increase in temperature and expand into the gap or crevice. However, even in the expanded state, respective surfaces of the conductive structure do not physically contact the respective surfaces of the one or more insulating layers.

20 Claims, 24 Drawing Sheets

(52) U.S. Cl.
CPC ............... *H01L 2224/0233* (2013.01); *H01L 2224/03001* (2013.01); *H01L 2224/0401* (2013.01); *H01L 2224/04042* (2013.01)

(58) Field of Classification Search
CPC . H01L 23/5286; H01L 23/528; H01L 23/481; H01L 23/535; H01L 23/5384; H01L 23/5386; H01L 23/53223; H01L 23/53238; H01L 23/53252; H01L 23/53266; H01L 24/05–06; H01L 24/02; H01L 24/03; H01L 21/76832; H10D 62/115; H10D 62/116; H10D 64/687; H10D 64/679

See application file for complete search history.

(56) References Cited

U.S. PATENT DOCUMENTS

| | | | |
|---|---|---|---|
| 5,596,215 | A | 1/1997 | Huang |
| 6,184,138 | B1 | 2/2001 | Ho et al. |
| 6,236,077 | B1 | 5/2001 | Gambino et al. |
| 7,232,746 | B2 | 6/2007 | Shim |
| 7,262,127 | B2 | 8/2007 | Ishikawa |
| 8,431,483 | B2 | 4/2013 | Sun et al. |
| 9,343,357 | B2 | 5/2016 | Xu et al. |
| 10,867,892 | B1 | 12/2020 | Chang et al. |
| 2002/0019127 | A1 | 2/2002 | Givens |
| 2002/0175420 | A1 | 11/2002 | Dorleans |
| 2007/0012905 | A1 | 1/2007 | Huang |
| 2008/0284006 | A1 | 11/2008 | Hong et al. |
| 2011/0260317 | A1 | 10/2011 | Lu et al. |
| 2012/0028458 | A1 | 2/2012 | Cabral, Jr. et al. |
| 2012/0112350 | A1 | 5/2012 | Kriz et al. |
| 2013/0270699 | A1 | 10/2013 | Kuo et al. |
| 2015/0255336 | A1* | 9/2015 | Moon .................... H01L 23/481 204/192.15 |
| 2015/0270178 | A1 | 9/2015 | Alptekin et al. |
| 2016/0225731 | A1 | 8/2016 | Chandolu et al. |
| 2017/0047242 | A1 | 2/2017 | Sun et al. |
| 2017/0092605 | A1 | 3/2017 | Tonegawa |
| 2017/0194152 | A1 | 7/2017 | Chang et al. |
| 2020/0006130 | A1 | 1/2020 | Chang et al. |
| 2020/0105577 | A1* | 4/2020 | Liang .................... H10D 30/62 |
| 2020/0126935 | A1 | 4/2020 | Wu |
| 2020/0373333 | A1 | 11/2020 | Liang et al. |
| 2021/0098400 | A1 | 4/2021 | Shen et al. |
| 2021/0366820 | A1* | 11/2021 | Uzoh .................... H01L 23/5283 |
| 2022/0246534 | A1* | 8/2022 | Chin .................... H01L 21/7685 |
| 2022/0246567 | A1 | 8/2022 | Lin et al. |
| 2022/0415705 | A1 | 12/2022 | Doria |
| 2023/0066861 | A1 | 3/2023 | Lee et al. |
| 2024/0088012 | A1 | 3/2024 | Milanesi et al. |

\* cited by examiner

SEMICONDUCTOR PACKAGE OR DEVICE WITH BARRIER LAYER

BACKGROUND

Technical Field

The present disclosure is directed to a semiconductor package or device including a barrier layer to protect a conductive layer within the semiconductor package or device.

Description of the Related Art

Generally, conventional semiconductor devices or packages include conductive layers present within the conventional semiconductor packages to form electrical pathways and connections within the conventional semiconductor packages. These conductive layers may be in the form of conductive vias, conductive lines, or some other type of conductive layer to form electrical pathways or connections along which electrical signals may travel through the semiconductor package. The electrical signals may be control signals, data signals, interrupt signals, or some other type of signal that the conventional semiconductor package is to receive from another electrical device or transmit to another electrical device. The conductive layers may be damascene conductive layers that are susceptible to corrosion when exposed to environmental qualities of an environment external to the conventional semiconductor package. These environmental qualities may include moisture (e.g., droplets, humidity, etc.), debris, or contaminants that may corrode the damascene conductive layer. When the damascene conductive layer is exposed to these environmental qualities, the damascene conductive layer may corrode more quickly than expected resulting in the usable lifespan of the conventional semiconductor packages or devices to be reduced as the conventional semiconductor packages or devices may malfunction earlier than expected.

In the conventional semiconductor devices or packages, a conductive structure (e.g., contact pad, under bump metallization (UBM), etc.) may be coupled to the damascene conductive layer such that the conventional semiconductor packages may be coupled to an external electrical device, coupled to a redistribution layer (RDL) of the conventional semiconductor packages, or coupled to a wire bond (e.g., ball and stich, etc.). However, the conductive structure as well as insulating layers of the conventional semiconductor packages may be susceptible to mechanical issues caused by thermal expansion and contraction due to changes in temperature. These mechanical issues may result in openings or points of the conductive layers within the conventional semiconductor packages or devices becoming exposed to an environment external to the conventional semiconductor packages or devices and result in the conductive layers being exposed to moisture, debris, or contaminants within the external environment. These mechanical issues may reduce the electromigration (EMG) performance of the conductive and conductive structures in which mechanical issues occur.

BRIEF SUMMARY

The present disclosure is directed to at least some embodiments of structures, which may be utilized within semiconductor packages or devices, including conductive structures. In some embodiments, crevices are adjacent to the conductive structures such that the crevices separate surfaces of insulating layers adjacent to the conductive structures from surfaces of the conductive structures. These crevices provide clearance between respective surfaces of the conductive structures and the insulating layers to provide clearance for expansion and contraction of the conductive structures. The clearance provided by these crevices adjacent to the conductive structures reduce the likelihood of mechanical issues in the conductive structures and the insulating layers. This reduction in the likelihood of crack propagation, delamination, and detachment may improve the yield of semiconductor packages or devices manufactured with the conductive structures and crevices, and may reduce scrap costs as there are fewer defective semiconductor packages or devices manufactured when utilizing the conductive structures and crevices. This reduction in the likelihood of mechanical issues results in the electromigration (EMG) performance of the conductive structure remaining higher than if mechanical issues occurred in the conductive structure, which generally reduce the EMG performance of the conductive structure.

To reduce the likelihood of moisture, debris, and contaminants from an external environment reaching conductive layers within the semiconductor packages or devices, barrier layers are provided between the conductive structures and the conductive layers within the semiconductor devices or packages. These conductive layers may form electrical connections and pathways within the semiconductor devices and packages, and these conductive layers may be conductive damascene layers. As moisture, debris, or contaminants may enter the crevices between the conductive structures and the insulating layers, the barrier layers are provided to reduce the likelihood of exposing the conductive layers within the semiconductor packages or devices to moisture, debris, or contaminants from an external environment. As the barrier layers prevent the moisture, contaminants, or debris from reaching the conductive layers, the likelihood of corrosion of the conductive layers within the semiconductor packages or devices due to being exposed to moisture, contaminants, or debris from the external environment is reduced.

In at least one embodiment, a semiconductor package includes a conductive damascene layer within the semiconductor package including a first surface. A barrier layer is coupled to the first surface such that the barrier layer entirely covers the first surface sealing the conductive damascene layer from an external environment outside the semiconductor package. The barrier layer is made of an electrically conductive material. A conductive structure is coupled to a second surface of the barrier layer that faces away from the first surface of the damascene layer. The barrier layer separates the conductive structure from the first surface of the damascene layer. The conductive structure includes a first portion having a first dimension in a first direction, and a second portion with a second dimension in the first direction that is greater than the first dimension. The second portion is stacked on the first portion and is integral the first portion such that the second portion overlaps the first portion. Respective surfaces of the first portion and the second portion are separated from respective surfaces of insulating layers of the semiconductor package or device by a crevice that extends along the respective surfaces of the first portion, the second portion, and the insulating layers. The crevice may extend continuously along these respective surfaces of the first portion, the second portion, and the insulating layers to the barrier layer such that the crevice may expose the barrier layer to moisture, debris, or contaminants within the external environment outside the semiconductor device or package. However, the barrier layer prevents the moisture, debris, or contaminants from reaching the conductive layers within the semiconductor device or package.

BRIEF DESCRIPTION OF THE SEVERAL VIEWS OF THE DRAWINGS

For a better understanding of the embodiments, reference will now be made by way of example to the accompanying drawings. In the drawings, identical reference numbers identify the same or similar elements or acts unless the context indicates otherwise. The sizes and relative proportions of the elements in the drawings are not necessarily drawn to scale. For example, some of these elements may be enlarged and positioned to improve drawing legibility.

DETAILED DESCRIPTION

Figure 1:
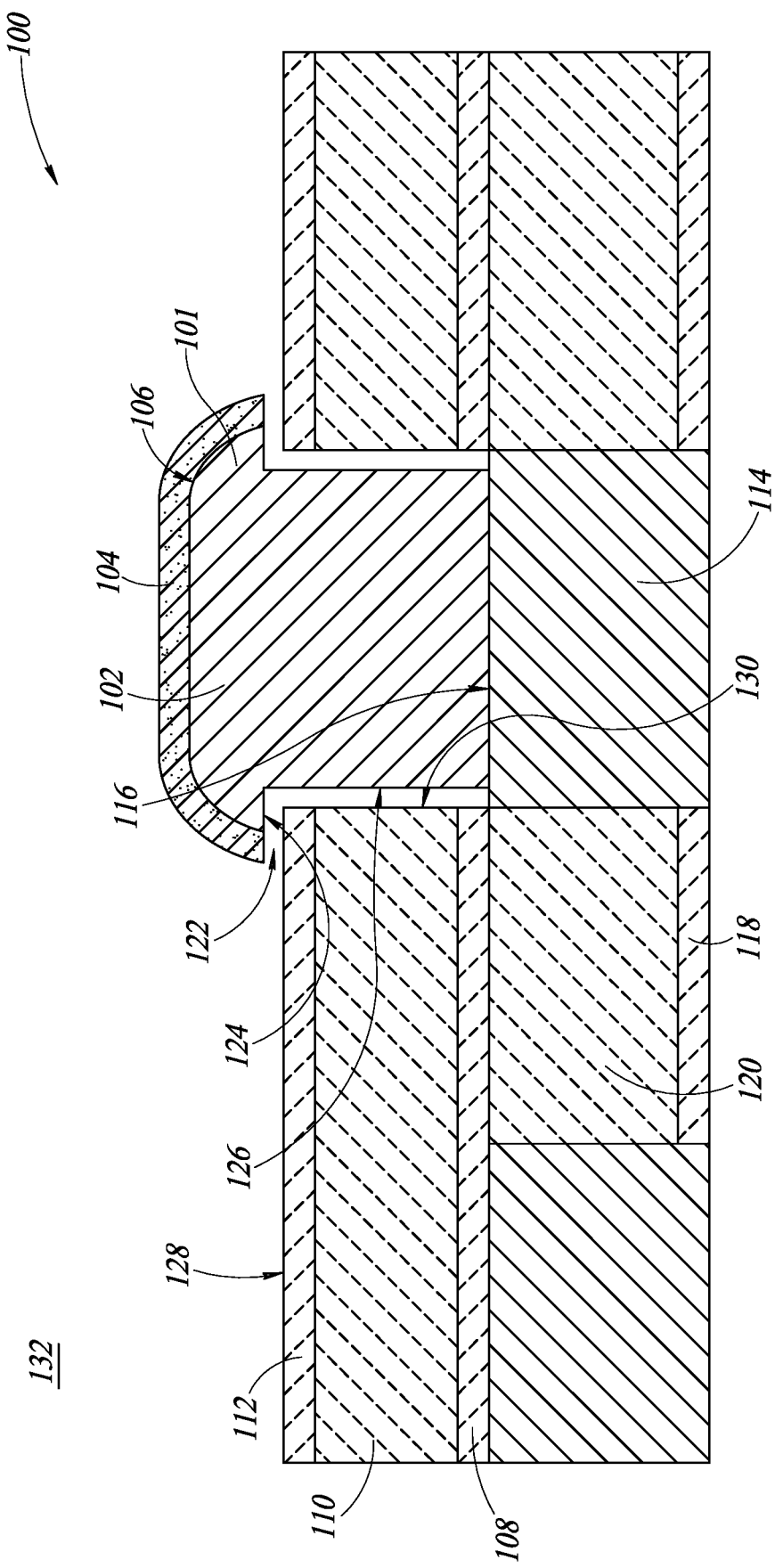
FIG. 1 is a cross-sectional view of a conductive structure of a semiconductor package.

In the following description, certain specific details are set forth in order to provide a thorough understanding of various embodiments of the disclosure. However, one skilled in the art will understand that the disclosure may be practiced without these specific details. In other instances, well-known structures associated with electronic components, packages, and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second, third, etc., does not necessarily imply a ranked sense of order, but rather may only distinguish between multiple instances of an act or a similar structure or material.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms "top," "bottom," "upper," "lower," "left," and "right," are used for only discussion purposes based on the orientation of the components in the discussion of the figures in the present disclosure as follows. These terms are not limiting as to the possible positions explicitly disclosed, implicitly disclosed, or inherently disclosed in the present disclosure.

The term "substantially" is used to clarify that there may be slight differences and variations when a package is manufactured in the real world, as nothing can be made perfectly equal or perfectly the same. In other words, "substantially" means and represents that there may be some slight variation in actual practice and instead is made or manufactured within selected tolerances.

As used in this specification and the appended claims, the singular forms "a," "an," and "the" include plural referents unless the content clearly dictates otherwise.

The present disclosure is directed to at least some embodiments of structures that may be utilized within electronic devices (e.g., semiconductor packages, semiconductor devices, Wafer Level Chip Scale Packages (WLCSP), etc.) that include one or more conductive structures of the present disclosure. In some embodiments, crevices are adjacent to the conductive structures, and the crevices space apart respective surfaces of insulating layers from respective surfaces of the conductive structures. These crevices adjacent to the conductive structures reduce the likelihood of mechanical issues within the conductive structures and the insulating layers of the electronic devices. This reduction in the likelihood of mechanical issues may improve the yield of semiconductor devices or packages manufactured with the conductive structures and the crevices, and may reduce scrap costs as there are fewer defective electronic devices (e.g., semiconductor packages or devices) manufactured when utilizing the conductive structures and the crevices as discussed herein within the present disclosure.

For example, the likelihood of the conductive structures physically contacting the insulating layers of the semiconductor packages or devices is decreased as the crevices provide clearance such that the conductive structures do not physically contact the insulating layers when the conductive structures are deformed. This deformation of the conductive structures may be from thermal expansion (e.g., temperature increase and changes) or other physical forces (e.g., compression forces) that may expand and deform the conductive structures (e.g., other physical forces such as compression forces when coupling wire bonds (e.g., ball and stitch) to the conductive structures). The crevices reduce the likelihood of the conductive structures physically contacting the insulating layers as the conductive structures may expand into the crevices without physically contacting the insulating layers.

While the crevices provide this clearance between the conductive structures and the insulating layers, barrier layers are provided between the conductive structures and conductive layers within the semiconductor devices or packages. These conductive layers may be electrical connections and pathways within the semiconductor devices and packages, and these conductive layers may be conductive damascene layers. As moisture, debris, and contaminants from an external environment may enter the crevices between the conductive structures and the insulating layers, the barrier layers are provided to reduce the likelihood of exposure of the conductive layers within the package to moisture, debris, and contaminants from the external environment. As the barrier layer prevents the moisture, debris, and contaminants from reaching the conductive layers, the likelihood of corrosion of the conductive layers within the semiconductor packages or devices due to exposure to moisture, debris, and contaminants is reduced. By reducing the likelihood of corrosion of the conductive layers within the semiconductor packages or devices, the usable lifespan of the semiconductor packages or devices may be increased, and the likelihood of manufacturing a defective semiconductor packages or devices is reduced.

For example, while contaminants (e.g., fluids, gases, debris particles, moisture, etc.) may enter the crevice, the barrier layer stops the contaminants from reaching the conductive layers, which may be conductive damascene layers, on which the barrier layers are present. In other words, the barrier layers act as barriers or walls that prevent (e.g., blocks, stops, etc.) the contaminants from reaching the conductive layers within the semiconductor packages or devices. This reduction in the likelihood of corrosion of the conductive layers may improve the yield of semiconductor devices or packages manufactured with the conductive structures and the crevices, and may reduce scrap costs as there are fewer defective semiconductor devices or packages manufactured when utilizing the conductive structures and crevices.

In view of the above discussion, the crevices reduce the likelihood of mechanical issues within the conductive structures and the insulating layers of the semiconductor packages or devices, and the barrier layers reduce the likelihood of corrosion of the conductive layers within the semiconductor devices and packages by reducing the likelihood that the conductive layers are exposed to moisture, debris, and contaminants from an external environment. These reductions in the likelihood of mechanical issues and corrosion may improve the yield of usable semiconductor devices or packages, and, accordingly, also may reduce scrap costs due to defective semiconductor devices or packages manufactured.

This reduction in the likelihood of mechanical issues improves the overall electromigration (EMG) performance of the conductive structure relative to if mechanical issues occurred in the conductive structure. For example, mechanical issues in the conductive structure generally result in electrons having a more difficult path or longer path to move along the conductive structure which decreases the overall EMG performance of the conductive structure. Accordingly, reducing the likelihood of the mechanical issues by providing the crevice adjacent to the conductive structure provides clearance in the situation in which the conductive structure expands due to a change in temperature allowing for the efficiency of the EMG performance of the conductive structure to remain high relative to when these mechanical issues occur in the conductive structure.

FIG. 1 is directed to a cross-sectional view of a structure 100, which has a stacked configuration, including a conductive structure 101 that may be utilized within a semiconductor package or device. For example, the conductive structure 101 may be a contact pad or a contact structure of a semiconductor die, a printed circuit board (PCB), or some other similar or like type of electrical device, component, or structure of a semiconductor device or package. Other conductive structures or layers (see FIGS. 6-11 of the present disclosure) may be coupled to form electrical connections or pathways within a semiconductor device or package in which the conductive structure 101 is present.

The conductive structure 101 includes a first conductive material 102 and a second conductive material 104 that is on and covers a surface 106 of the first conductive material 102. The second conductive material 104 is thinner relative to the first conductive material 102. As shown in FIG. 1, the surface 106 is curved.

The conductive structure 101 extends into a first insulating layer 108, a second insulating layer 110, and a third insulating layer 112 to a conductive layer 114, and the conductive structure 101 is on a surface 116 of the conductive layer 114 such that the conductive structure 101 is coupled to the conductive layer 114. A fourth insulating layer 118 and a fifth insulating layer 120 are around the conductive layer 114 such that the conductive layer 114 is within the fourth and fifth insulating layers 118, 120.

A crevice 122 extends around the conductive structure 101 and extends along a first surface 124 of the conductive structure 101 and a first sidewall 126 of the conductive structure 101 that is transverse to the first surface 124. The crevice 122 is between the first surface 124 and a second surface 128 of the third insulating layer 112. The second surface 128 faces away from the first and second insulating layers 108, 110. The crevice 122 is between the first sidewall 126 and a second sidewall 130 that faces towards the first sidewall 126. The second sidewall 130 includes sidewalls of the first, second, and third insulating layers 108, 110, 112, which may be coplanar and flush with each other along the second sidewall 130. The crevice 122 extends continuously along the first surface 124, the first sidewall 126, the second surface 128, and the second sidewall 130 to the surface 116 of the conductive layer 114 that is not covered by the conductive structure 101. Since the surface 116 of the conductive layer 114 is not covered by the conductive structure 101, contaminants (e.g., debris, gasses, liquids, fluids, moisture, etc.) may enter into the crevice 122 from an external environment 132 resulting in the surface 116 of the conductive layer 114 being exposed to the contaminants (e.g., debris, gasses, liquids, fluids, moisture, etc.) within the external environment 132. This exposure of the surface 116 of the conductive layer 114 to the contaminants (e.g., debris, gasses, liquids, fluids, moisture, etc.) may result in the conductive layer 114 corroding due to the contaminants, which may result in the electronic device (e.g., semiconductor package or device) including the conductive structure 101 becoming defective.

However, the crevice 122 is present to reduce the likelihood of mechanical issues with respect to the conductive structure 101 and the first, second, and third insulating layers 108, 110, 112 when coupling a conductive structure, layer, or wire bond to the conductive structure 101. For example, when a wire bond (e.g., ball and stitch) is coupled to the conductive structure 101 through a wire bond formation technique, the conductive structure 101 may expand into the crevice 122 such that the first surface 124 moves closer to the second surface 128 and the first sidewall 126 moves closer to the second sidewall 130. The crevice 122 provides clearance such that the first surface 124 does not physically contact the second surface 128 and the first sidewall 126 does not physically contact the second sidewall 130 due to this expansion of the conductive structure 101. If the first surface 124 and first sidewall 126, respectively, were to physically contact and apply pressure to the second surface 128 and the second sidewall 130, respectively, mechanical issues may propagate within the conductive structure 101 or the first, second, and third insulating layers 108, 110, 112 such that contaminants (e.g., contaminant particles, gasses, liquids, fluids, moisture, etc.) in the external environment 132 may readily reach conductive features and structures (e.g., the conductive layer 114) present within the electronic device, which may be a semiconductor package or device. These contaminants may result in the conductive features and structures (e.g., conductive layer 114) corroding such that the electronic device either being manufactured or already manufactured becomes defective such that the electronic device does not function within preferred or expected tolerances.

In view of the above discussion, the present disclosure is directed to providing crevices and barrier layers between various layers of electronic devices (e.g., semiconductor devices or packages) to reduce the likelihood of mechanical issues while also providing a reduced likelihood of corrosion due to external contaminants from an external environment. For example, barrier layers 230, 302 and crevices 260 at least as shown in FIGS. 2A and 3A reduce the likelihood of respective conductive layers within semiconductor devices and packages in which the barrier layers 230, 302 and the crevices 260 are present.

In some embodiments, the barrier layers 230, 302 may be formed with a TiW (titanium tungsten) material doped with copper or copper-alloy atoms or molecules. For example, FIGS. 2A, 2B, 3A, and 3B include examples of embodiments in which the barrier layers 230, 302, respectively are made of the TiW material doped with the copper or copper-alloy atoms or molecules. The TiW material prevent against corrosion while the copper or copper-alloy atoms or molecules doping the TiW material allow for electroless deposition to be utilized to form a conductive structure of NiPd (nickel palladium) or of some other conductive material on the barrier layers 230, 302.

In some embodiments the barrier layers 230, 302 may include a copper or copper-alloy layer (e.g., Cu or AlCu) stacked on a TiW layer such that the barrier layers 230, 302 include a first layer of TiW and a second layer of copper (Cu) or a copper-alloy (CuAl) stacked on the first layer of TiW. For example, FIGS. 12-14 include examples of embodiments of barrier layers made of the first layer of TiW on which the second layer of the copper or copper-alloy is stacked on the first layer of TiW. The TiW layer prevents against corrosion while the copper or copper-alloy lay allows for electroless deposition to be utilized to form a conductive structure of NiPd (nickel palladium) or of some other conductive material on the copper or copper alloy layer.

Figure 2A:
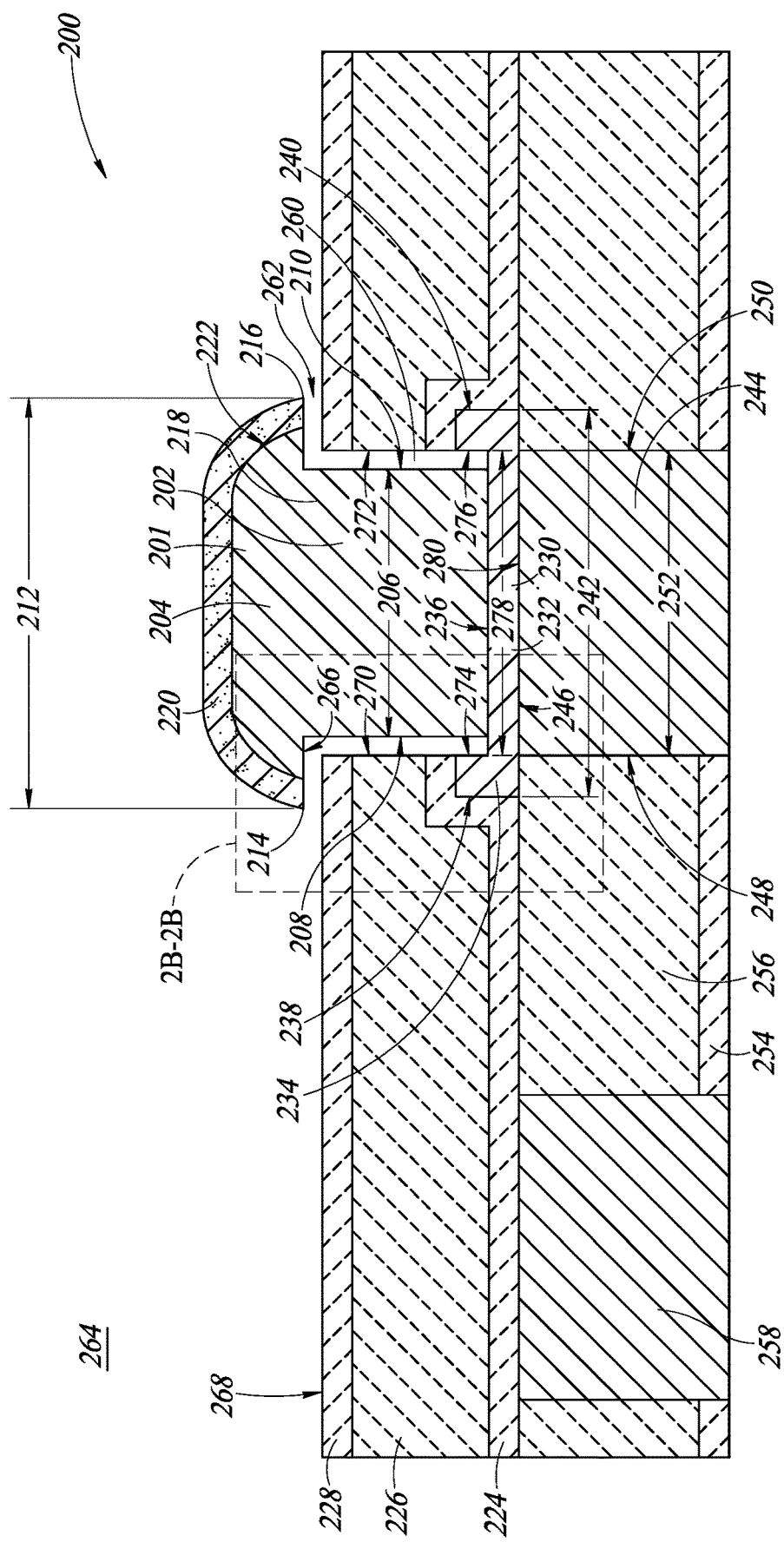
FIG. 2A is a cross-sectional view of an embodiment of a conductive structure of a semiconductor package of the present disclosure.
Figure 3A:
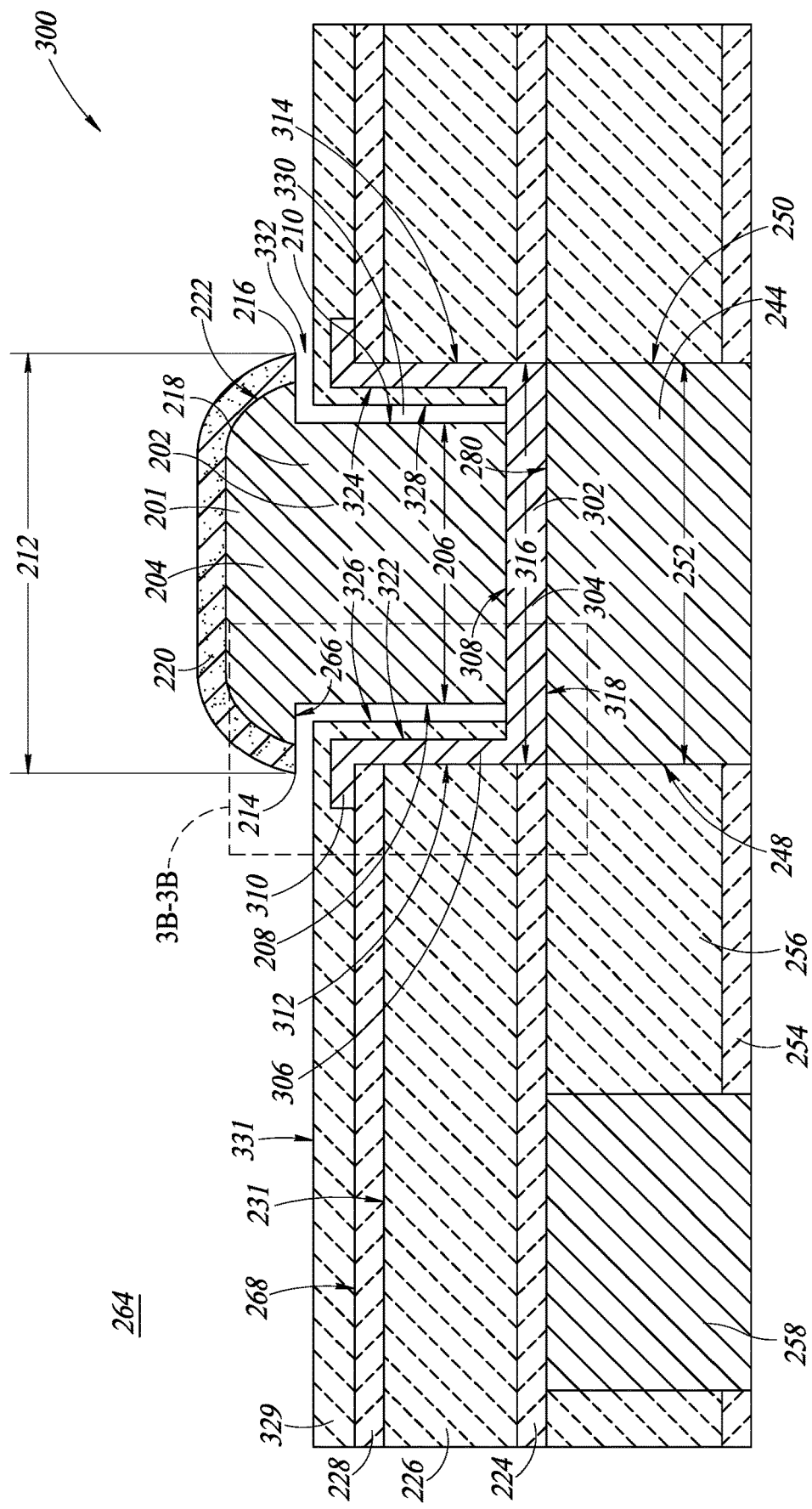
FIG. 3A is a cross-sectional view of an alternative embodiment of a conductive structure of a semiconductor package of the present disclosure.

FIG. 2A is directed to an embodiment of a structure 200, which is in a stacked configuration, including a conductive structure 201 that may be utilized within or as part of an electronic device (e.g., semiconductor device, semiconductor package, semiconductor die, semiconductor chip, printed circuit board (PCB), or some other similar or like type of electronic device in which the conductive structure 201 may be present). The conductive structure 201 may be a contact pad, a contact structure, or some other similar or like conductive structure to which another conductive feature, structure, or layer may be coupled to form an electrical pathway or connection to the electronic device in which the conductive structure 201 is present.

The conductive structure 201 includes a first portion 202 and a second portion 204 that is coupled to the first portion 202. Based on the orientation as shown in FIG. 2A, the second portion 204 is stacked on the first portion 202. As shown in FIG. 2A, the conductive structure 201 has a mushroom-like shape.

A first dimension 206 extends from a first sidewall 208 of the first portion 202 to a second sidewall 210 of the first portion 202. The first dimension 206 extends in a first direction directed from the first sidewall 208 to the second sidewall 210. In some embodiments, when the first portion 202 is a rectangular prism, the first and second sidewalls 208, 210 may be two separate sidewalls of the first portion 202, and the first dimension may be a width of the first portion 202. In some embodiments, when the first portion 202 is cylindrical, the first and second sidewalls 208, 210 may be portions of a continuous sidewall that extends and wraps around the first portion 202, and the first dimension 206 may be a diameter of the first portion 202.

A second dimension 212 of the second portion 204 extends from a first point 214 of the second portion 204 to a second point 216 of the second portion 204 that is opposite to the first point 214. In some embodiments, when the first portion 202 is a rectangular prism, the first and second points 214, 216 may be at and along respective edges of the second portion 204 such that the respective edge at which the first point 214 is present is opposite to the respective edge at which the second point is present. In some embodiments, when the second portion 204 is semi-cylindrical, the first and second points 214, 216 may be along a circular edge of the second portion 204 that extends and wraps around the second portion 204. The second dimension 212 is larger than the first dimension 206. The second dimension 212 extends in the first direction similar to the first dimension 206. The first and second points 214, 216, respectively, may be referred to as a first end point and a second end point, respectively. The first and second points 214, 216 may be referred to as a first end and a second end, respectively.

The conductive structure 201 includes a first conductive layer 218 and a second conductive layer 220 that is on and covers the first conductive layer 218. Based on the orientation as shown in FIG. 2A, the second conductive layer 220 is stacked on the first conductive layer 218. The second conductive layer 220 is on and covers a surface 222 of the first conductive layer 218. As shown in FIG. 2A, the surface 222 is curved. The second portion 204 includes a piece of the first conductive layer 218 and all of the second conductive layer 220.

In some embodiments, the first conductive layer 218 may be a different conductive material than a conductive material of the second conductive layer 220. For example, in some embodiments, the first conductive layer 218 may be made of or include a nickel (Ni) material, a nickel-alloy material, or some other similar or like type of conductive material that includes nickel, and the second conductive layer 220 may be made of or include a palladium (Pd) material, a palladium-alloy material, or some other similar or like type of conductive material that includes palladium. In some alternative embodiments, the first conductive layer 218 may be made of or include some other conductive material or materials other than nickel, and the second conductive layer 220 may be made of or include some other conductive material other than palladium.

Figure 2B:
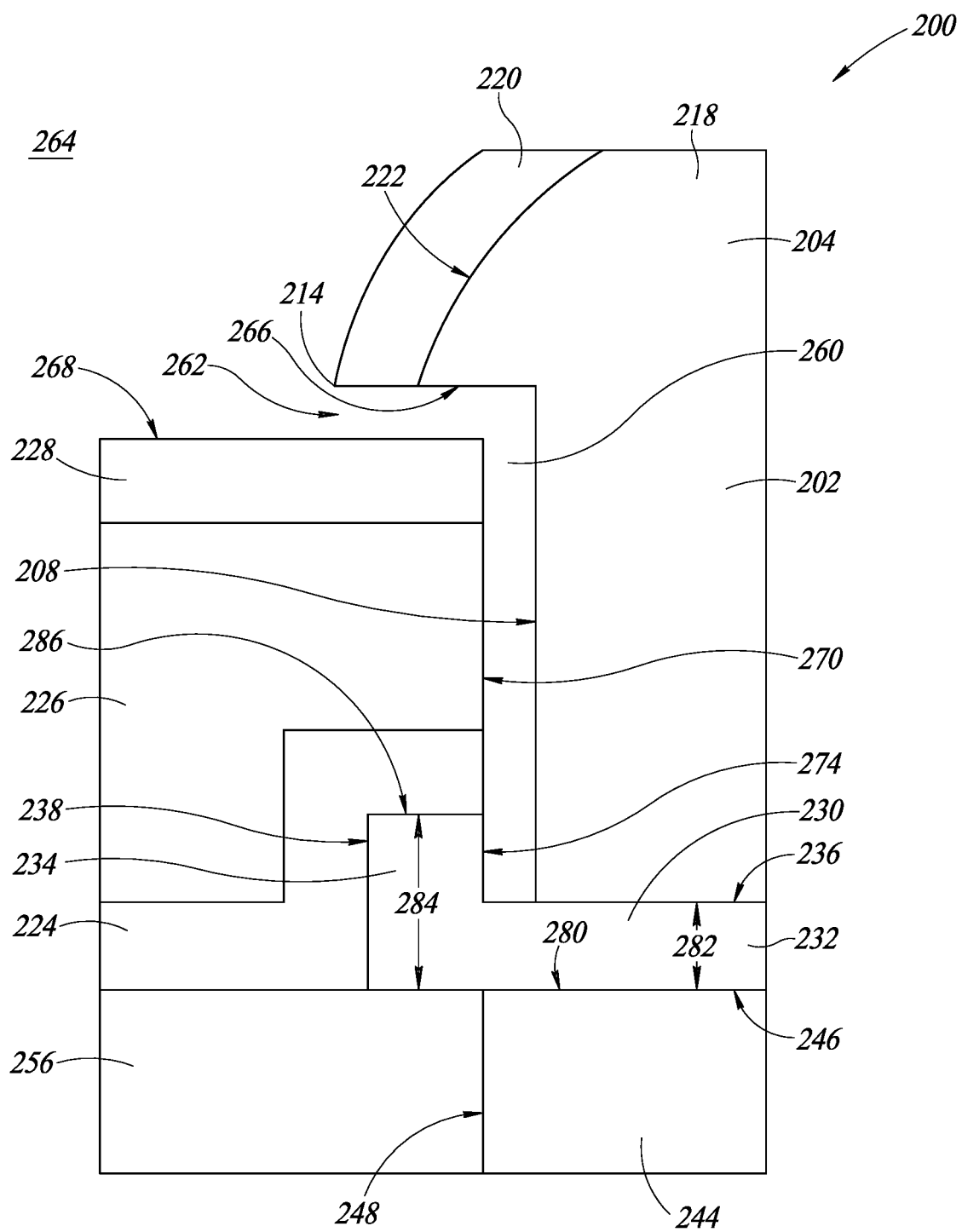
FIG. 2B is an enhanced, zoomed in view of section 2B-2B of the embodiment of the conductive structure of the semiconductor package as shown in FIG. 2A.
Figure 12:
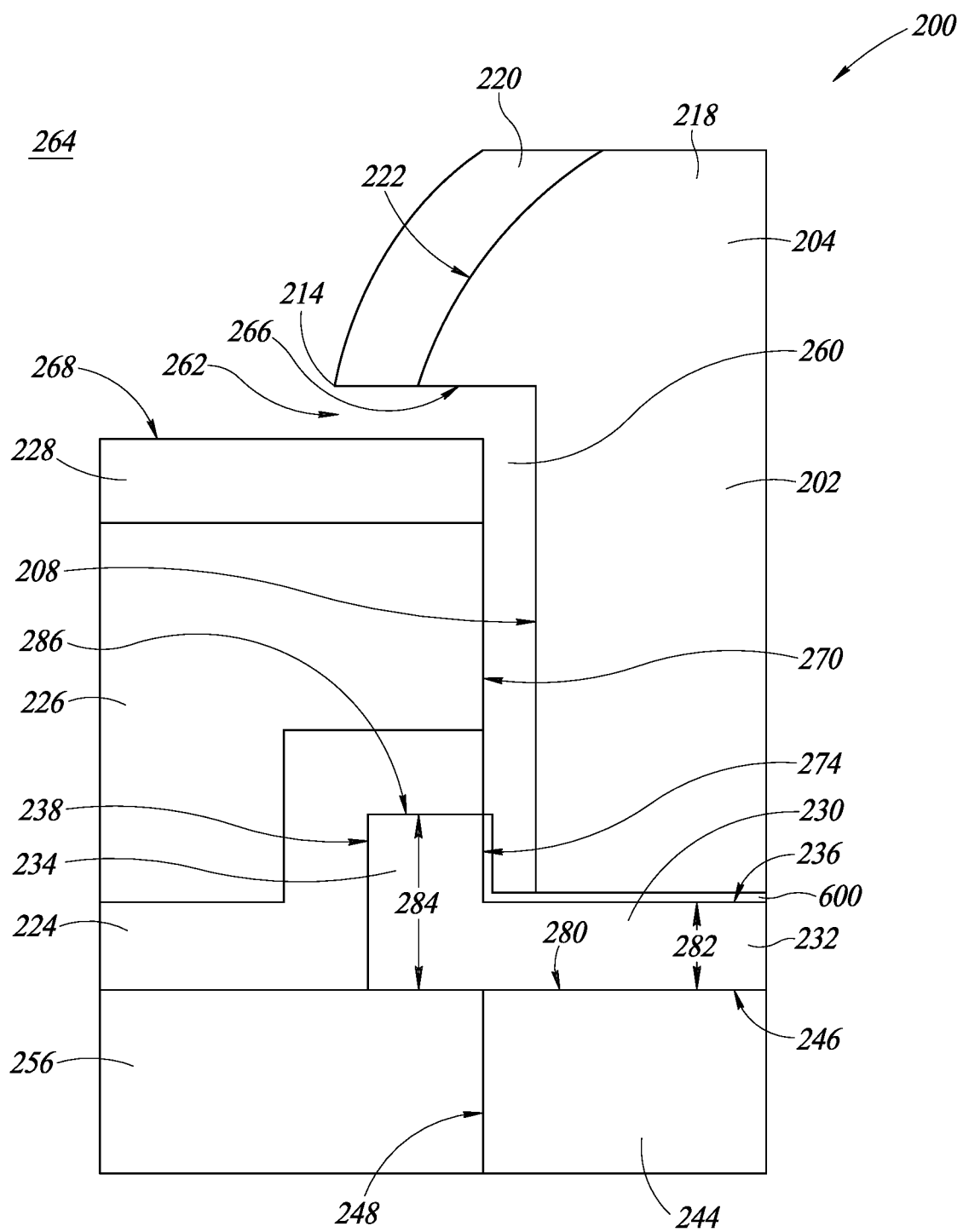
FIG. 12 is a cross-sectional, enhanced, and zoomed in view of a portion of an alternative embodiment of a conductive structure of a semiconductor package of the present disclosure similar to the embodiment as shown in FIGS. 2A and 2B of the present disclosure.
Figure 13:
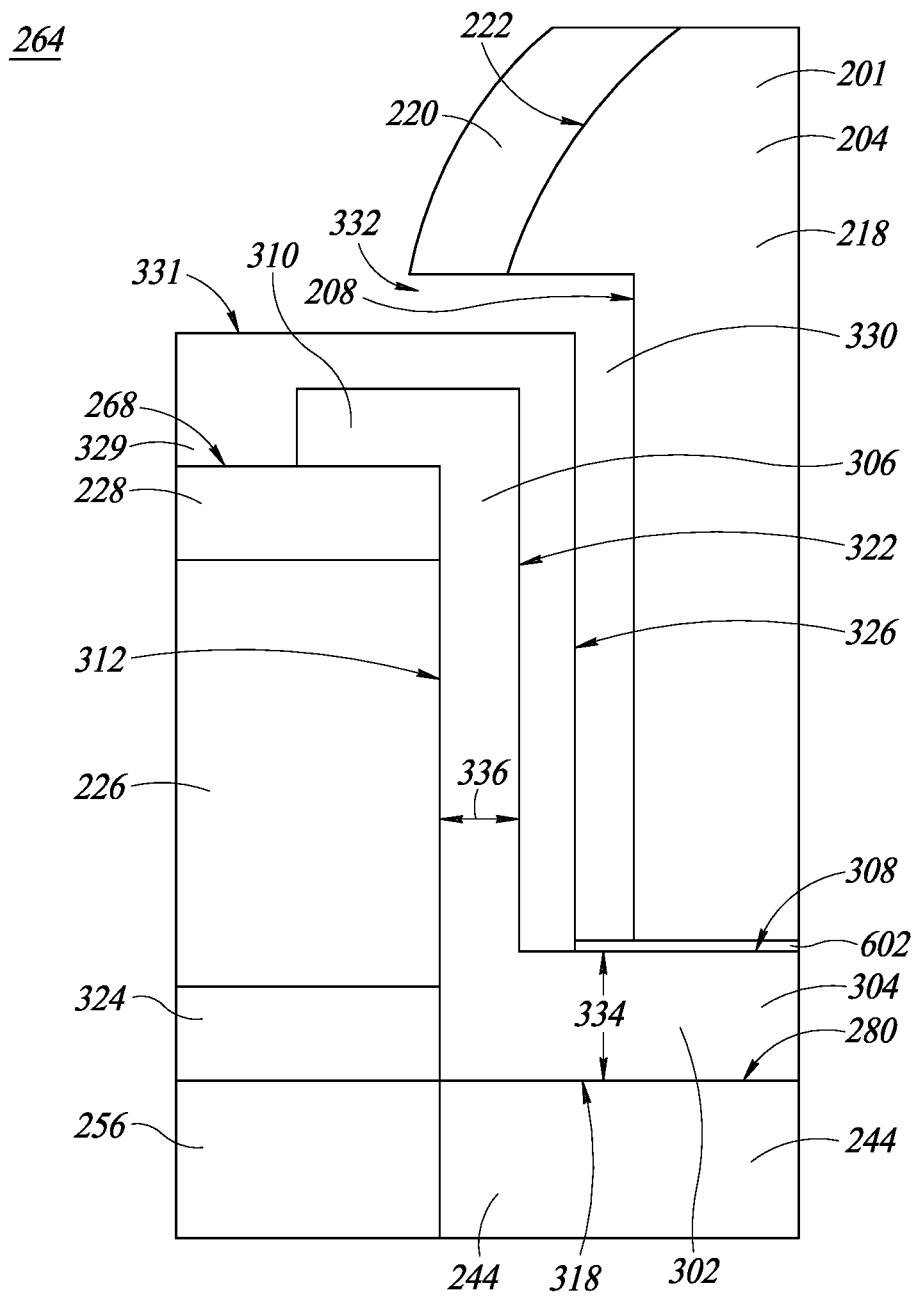
FIG. 13 is a cross-sectional, enhanced, and zoomed in view of a portion of an alternative embodiment of a conductive structure of a semiconductor package of the present disclosure similar to the embodiment as shown in FIGS. 3A and 3B of the present disclosure.
Figure 14:
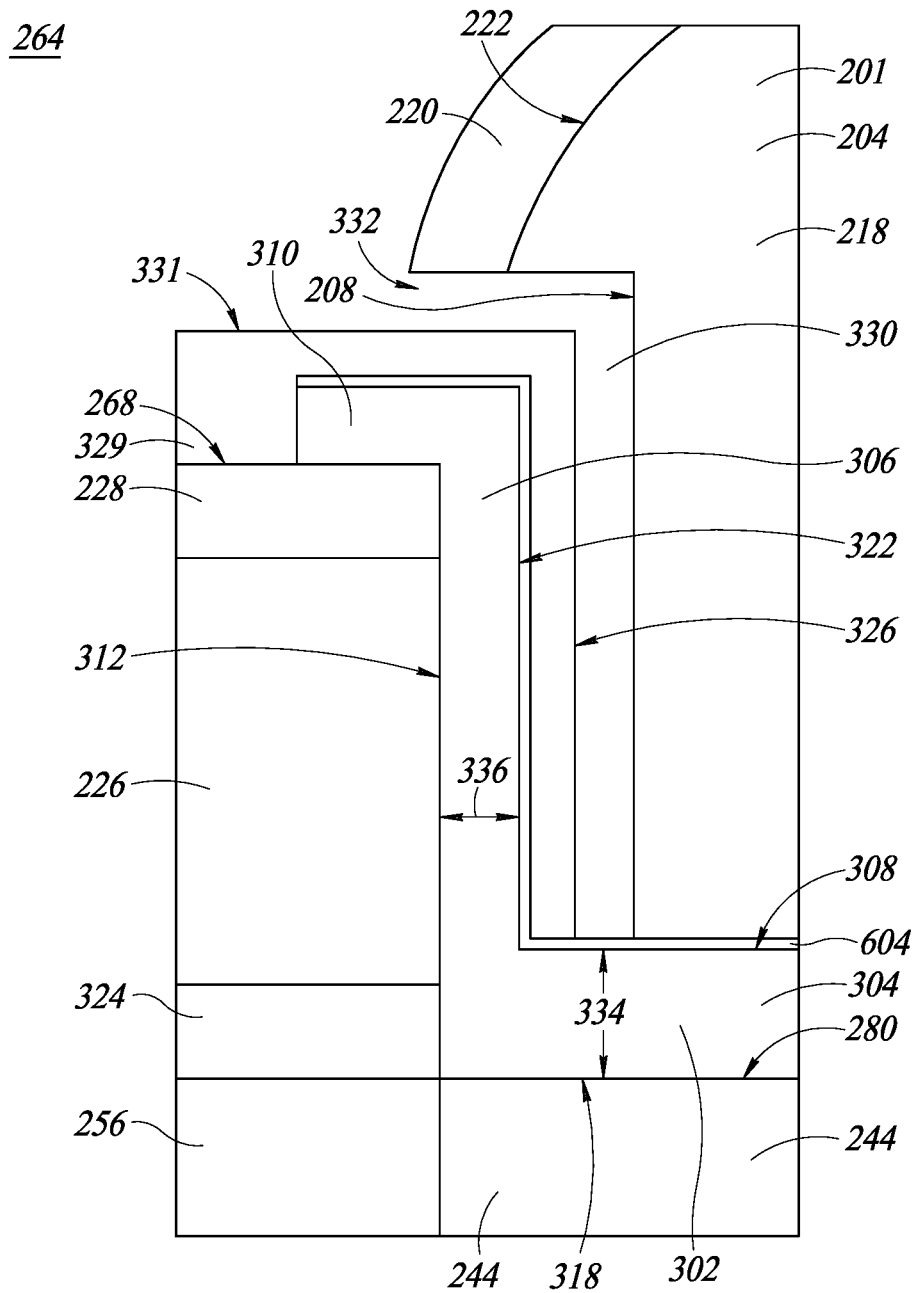
FIG. 14 is a cross-sectional, enhanced, and zoomed in view of an alternative embodiment of a conductive structure of a semiconductor package of the present disclosure similar to the embodiment as shown in FIGS. 3A and 3B of the present disclosure.

The conductive structure 201 extends through a first insulating layer 224, a second insulating layer 226, and a third insulating layer 228 to a barrier layer 230. The barrier layer 230 includes a conductive material. For example, in some embodiments, the barrier layer 230 is made of or includes a different conductive material than the first and second conductive layers 218, 220 of the conductive structure 201. In some embodiments, the barrier layer 230 may be a titanium tungsten (TiW) material that is doped with a conductive material such as aluminum copper (AlCu) or copper (Cu). In some embodiments, the barrier layer 230 may include titanium tungsten (TiW) or the barrier layer 230 may include aluminum copper (AlCu) or copper (Cu). In some embodiments, the barrier layer 230 may be and include a first layer of titanium tungsten (TiW) on which a thin layer of aluminum copper (AlCu) or copper (Cu) relative to the TiW layer is deposited or stacked (see, for example, the embodiments as shown in FIGS. 12-14 of the present disclosure that are discussed in detail later within the present disclosure). In some embodiments, the barrier layer 230 may be made of or include a material that is resistant to corrosion based on environmental qualities (e.g., types of moisture, debris, contaminants, etc.) within an external environment 264 external to the electronic device (e.g., semiconductor package or device) either in the completed and manufactured electronic device or while manufacturing the electronic device within a semiconductor manufacturing plant (FAB). In some embodiments though, the TiW layer may be doped with another type of dopant or may not be doped with a dopant. However, for the purposes of the following discussion with respect to the barrier layer 230 as shown in FIGS. 2A and 2B, the barrier layer 230 is made of a TiW material doped with Cu, AlCu, or some other similar or like type of suitable copper material or copper alloy material.

In some embodiments, the first insulating layer 224 may be a Silicon Nitride (SiN) layer or some other suitable or like type of insulating or non-conductive material. In some embodiments, the second insulating layer 226 may be an oxide layer, insulating layer, or non-conductive layer known to the semiconductor industry. In some embodiments, the third insulating layer 228 may be a passivation layer made of a passivation material, an insulating material, or a non-conductive material known to the semiconductor industry.

The barrier layer 230 includes a central portion 232 at a central region of the barrier layer 230 and a peripheral portion 234 at a peripheral region of the barrier layer 230. The peripheral portion 234 extends around the central portion 232 such that the peripheral portion 234 extends around, wraps around, and surrounds the central portion 232. The peripheral portion 234 is raised relative to a recessed surface 236 of the barrier layer 230 that is at the central portion 232 of the barrier layer 230. The recessed surface 236 is recessed relative to the peripheral portion 234 of the barrier layer 230. The recessed surface 236 is coupled to the first portion 232 of the conductive structure 201 as the first portion 202 of the conductive structure 201 is on the recessed surface 236 at the central portion 232 of the barrier layer 230 as shown in FIG. 2A.

For example, when the barrier layer 230 is a TiW layer that is doped with a copper material (e.g., Cu, AlCu, etc.), the conductive structure 201 may be made of Nickel Palladium (NiPd) and the copper material doped within the TiW barrier layer 230 is present to further facilitate or enable forming the conductive structure 201 on the TiW barrier layer 230 doped with the copper material. However, while the copper material doped within the TiW barrier layer 230 may further facilitate or enable forming the NiPd conductive structure 201 on the TiW barrier layer 230 doped the copper material through, for example, an electroless deposition technique known within the semiconductor industry, the TiW barrier layer 230 is doped with a only small or trace amounts of the copper material (Cu, AlCu, etc.) such that any minor corrosion that may occur near or at the surface 236 of the TiW barrier layer 230 due to the presence of the small or trace amounts of the copper material dopant when forming the conductive structure 201 cannot reach or propagate within respective conductive layers (e.g., a first conductive layer 244) covered by the TiW barrier layer 230 doped with the small or trace amounts of copper material within the structure 200. In other words, while the small or trace amount of copper material dopant is present and doped within the TiW barrier layer 230, there is only enough to further facilitate or enable formation of the conductive structure 201 through, for example, electroless deposition while not enough to result in propagation of corrosion throughout the structure 200 such as in the first conductive layer 244.

A first sidewall 238 of the barrier layer 230 is opposite to a second sidewall 240 of the barrier layer 230 such that the first sidewall 238 and the second sidewall 240 face away from each other. The first and second sidewalls 238, 240 are sidewalls of the peripheral portion 234 of the barrier layer 230. A third dimension 242 extends from the first sidewall 238 to the second sidewall 240. In this embodiment, the third dimension 242 is greater than the first dimension 206 and is substantially equal to the second dimension 212. In some embodiments, the third dimension 242 is greater than the first dimension 206 and is less than the second dimension 212. In some embodiments, the third dimension 242 is greater than the first dimension 206 and is greater than the second dimension 212. The first sidewall 238 and the second sidewall 240, respectively, may be referred to as a first end and a second end, respectively, of the barrier layer 230.

The first conductive layer 244 is coupled to an internal surface 246 of the barrier layer 230 that is opposite to the recessed surface 236 of the barrier layer 230. The internal surface 246 of the barrier layer 230 overlaps the central and peripheral portions 232, 234 of the barrier layer 230, extends from the first sidewall 238 to the second sidewall 240 of the barrier layer 230, and has the third dimension 242 of the barrier layer 230. The recessed surface 236 is less wide than the internal surface 246 as shown in FIG. 2A. The first conductive layer 244 is protected from contaminants that may cause corrosion in the first conductive layer 244 by the barrier layer 230, which again in this embodiment is made of a TiW material doped with a small or trace amount of copper material (e.g., Cu, AlCu, or some other similar or like type of copper material or copper alloy material suitable being doped within the TiW material).

The first conductive layer 244 includes a first sidewall 248 and a second sidewall 250 opposite to the first sidewall 248. A fourth dimension 252 of the first conductive layer 244 extends from the first sidewall 248 to the second sidewall 250 in the first direction. In the embodiment as shown in FIG. 2A, the fourth dimension 252 is greater than the first dimension 206, is less than the second dimension 212, and is less than the third dimension 242. In some embodiments, the fourth dimension 252 is less than the first dimension 206. The first conductive layer 244 may be an electrical pathway, trace, track, or connection that extends through a fourth insulating layer 254 and a fifth insulating layer 256. The fourth and fifth insulating layers 254, 256 cover the first and second sidewalls 248, 250 of the first conductive layer 244.

A second conductive layer 258 extends through the fourth and fifth insulating layers 254, 256. Similar to the first conductive layer 244, the second conductive layer 258 may be an electrical pathway, trace, track, or connection that extends through the fourth and fifth insulating layers 254, 256. As shown in FIG. 2A, the fourth and fifth insulating layers 254, 256 cover respective sidewalls of the second conductive layer 258, and the first insulating layer 224 is on the fifth insulating layer 256.

The first and second conductive layers 244, 258 may be portions or part of a first metallization layer that extends through the fourth and fifth insulating layers 254, 256, respectively. In some embodiments, the first and second conductive layers 244, 258 may be in electrical communication with each other or may be electrically coupled to each other to form various electrical pathways or connections that may readily transmit electrical signals (e.g., control signals, data signals, etc.). The first and second conductive layers 244, 258 may be made of or include a copper material, a copper alloy material, or some other similar or like copper based material. In some embodiments, the first and second conductive layers 244, 258 may be made of some other non-copper based conductive material.

A crevice 260 is adjacent to the first portion 202 and the second portion 204 of the conductive structure 201. The crevice 260 surrounds the first portion 202 of the conductive structure 201. An opening 262 of the crevice 260 is overlapped by the second portion 204 of the conductive structure, is in fluid communication with an external environment 264 external to the conductive structure 201, and surrounds the first portion 202 of the conductive structure 201.

The crevice 260 extends between a first surface 266 of the second portion 204 of the conductive structure 201 and a second surface 268 of the third insulating layer 228. The first surface 266 faces towards the barrier layer 230 and is transverse to the first sidewall 208 of the conductive structure 201. The crevice 260 extends between a sidewall 270 and the first sidewall 208 of the conductive structure 201. The sidewall 270 is transverse to the second surface 268 and includes respective sidewalls of the first insulating layer 224, the second insulating layer 226, the third insulating layer 228, and the barrier layer 230 that are substantially coplanar and flush with each other along the sidewall 270. The sidewall 270 extends from the recessed surface 236 of the barrier layer 230 to the second surface 268 of the third insulating layer 228.

A sidewall 272 is opposite to the sidewall 270 and is on an opposite side of the conductive structure 201. The sidewall 272 extends from the recessed surface 236 to the second surface 268 of the third insulating layer 228. Similar to the sidewall 270 as shown in FIG. 2A, the sidewall 272 includes respective sidewalls of the first insulating layer 224, the second insulating layer 226, the third insulating layer 228, and the barrier layer 230 that are substantially coplanar and flush with each other along the sidewall 272.

A third sidewall 274 of the barrier layer 230 is at the sidewall 270 and a fourth sidewall 276 of the barrier layer 230 is at the sidewall 272. The third sidewall 274 is opposite to the fourth sidewall 276. The third sidewall 274 of the barrier layer 230 is spaced inward from the first sidewall 238 of the barrier layer 230, and the fourth sidewall 276 of the barrier layer 230 is spaced inward from the second sidewall 240 of the barrier layer 230.

A fifth dimension 278 extends from the third sidewall 274 to the fourth sidewall 276 in the first direction. As shown in FIG. 2A, the recessed surface 236 has the fifth dimension 278, and the fifth dimension 278 is greater than the first dimension 206, is less than the second dimension 212, is less than the third dimension 242, and is substantially equal to the fourth dimension 252. The fifth dimension 278 is larger than the first dimension 206 such that the first and second sidewalls 208, 210 of the first portion 202 of the conductive structure 201 are spaced apart from the respective sidewalls 270, 272 by the crevice 260.

A horizontal portion of the crevice 260 based on the orientation as shown in FIG. 2A extends along the first surface 266 and the second surface 268 to the first sidewall 208 of the first portion 202 of the conductive structure 201. A vertical portion of the crevice 260 based on the orientation as shown in FIG. 2A extends along the respective sidewalls 270, 272 and extends along the first and second sidewalls 208, 210 of the conductive structure 201.

The crevice 260 extends to the recessed surface 236 of the barrier layer 230 such that the barrier layer 230 prevents, stops, and blocks the crevice 260 from extending and reaching a surface 280 of the first conductive layer 244 that is coupled to the internal surface 246 of the barrier layer 230. In other words, the barrier layer 230 completely and entirely separates the crevice 260 from the first conductive layer 244, and completely and entirely separates the crevice 260 from the surface 280 of the first conductive layer 244 as well. The surface 280 of the first conductive layer 244 is transverse to the first and second sidewalls 248, 250 of the first conductive layer 244 and extends from the first sidewall 248 to the second sidewall 250.

As the barrier layer 230 completely and entirely separates the crevice 260 from the first conductive layer 244, while contaminants (e.g., debris, gasses, liquids, fluids, moisture, etc.) from the external environment 264 may enter the opening 262 and pass through the crevice 260 to the recessed surface 236 of the barrier layer 230, the contaminants (e.g., debris, gasses, liquids, fluids, moisture, etc.) cannot travel to or reach the first conductive layer 244. This prevents the first conductive layer 244 from being exposed to the contaminants (e.g., debris, gasses, liquids, fluids, moisture, etc.) and reduces the likelihood of the first conductive layer 244 being corroded by the contaminants (e.g., debris, gasses, liquids, fluids, moisture, etc.) while allowing the crevice 260 to be present to reduce the likelihood of mechanical issues with respect to at least the first, second, and third insulating layers 224, 226, 228 and the conductive structure 201.

FIG. 2B is a zoomed in view of section 2B-2B as shown in FIG. 2A. As shown in FIG. 2B, the central portion 232 of the barrier layer 230 has a first thickness 282 that extends from the internal surface 246 of the barrier layer 230 to the recessed surface 236 of the barrier layer 230. The barrier layer 230 includes a second thickness 284 that extends from the internal surface 246 to a raised surface 286 of the peripheral portion 234 that is raised relative to the recessed surface 236. As more readily seen in FIG. 2B, the peripheral portion 234 extends or protrudes outward from the recessed surface 236 by a difference between the first thickness 282 and the second thickness 284 (e.g., subtracting the value of the first thickness 282 from the value of the second thickness 284).

The raised surface 286 of the peripheral portion 234 of the barrier layer 230 is transverse to the respective sidewalls 238, 240, 274, 276 of the barrier layer 230. The first insulating layer 224 extends across the raised surface 286, covers the raised surface 286, and covers the first sidewall 238 of the barrier layer 230 that extends from the internal surface 246 to the raised surface 286. The raised surface 286 extends around the recessed surface 236 of the barrier layer 230. As shown in FIG. 2B, the first sidewall 238 has the second thickness 284 and is thicker than the third sidewall 274 as the third sidewall 274 has a thickness that is the difference of the first thickness 282 subtracted from the second thickness 284. In other words, the first sidewall 238 is taller than the third sidewall 274 based on the orientation as shown in FIG. 2B.

Figure 3B:
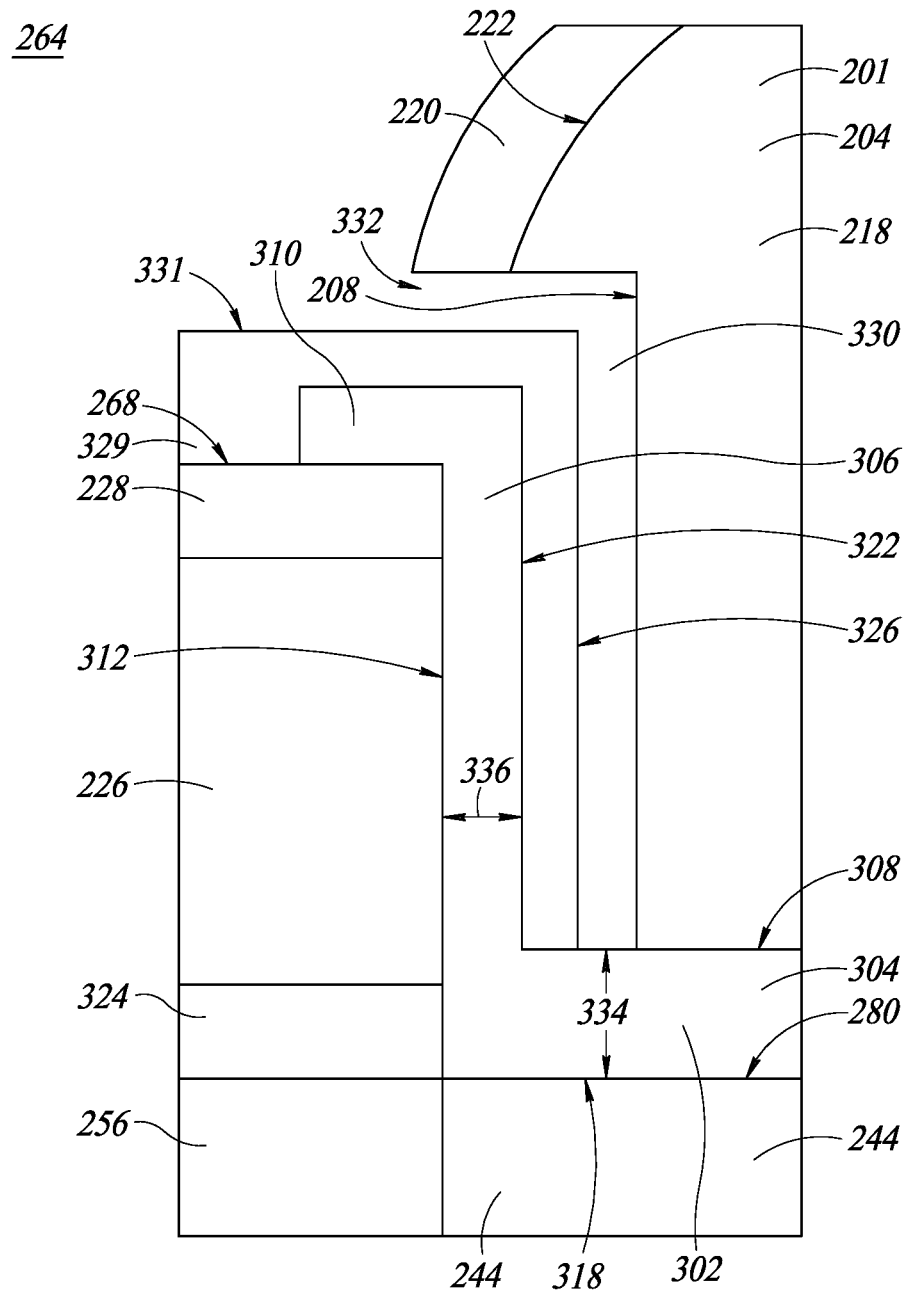
FIG. 3B is an enhanced, zoomed in view of section 3B-3B of the alternative embodiment of the conductive structure of the semiconductor package as shown in FIG. 3B.

FIGS. 3A and 3B are directed to an alternative embodiment of a structure 300 that includes the conductive structure 201. The structure 300 as shown in FIGS. 3A and 3B includes several of the same or similar features of the structure 200 as shown in FIGS. 2A and 2B as discussed in detail earlier herein. Accordingly, these same or similar features of the structure 200 as present in the structure 300 as shown in FIGS. 3A and 3B have been given the same or similar reference numerals as those corresponding features in FIGS. 2A and 2B.

The structure 300 further includes a barrier layer 302, which may be made of or includes a conductive material different from the conductive materials of the conductive structure 201. For example, in some embodiments, the barrier layer 230 may be a titanium tungsten (TiW) material that is doped with a conductive material such as aluminum copper (AlCu) or copper (Cu). In some embodiments, the barrier layer 302 may be made of or may include titanium tungsten (TiW) doped with an aluminum copper (AlCu) or copper (Cu) material (e.g., dopants). In some embodiments, the barrier layer 302 may be and may include a first layer of titanium tungsten (TiW) on which a thin layer of aluminum copper (AlCu) or copper (Cu) relative to the TiW layer is deposited or stacked (see, for example, the embodiments as shown in FIGS. 12-14 of the present disclosure that are discussed in detail later herein). In other words, the barrier layer 302 may be made of the same or similar materials as the barrier layer 230. For the purposes of the following discussion with respect to the barrier layer 302 as shown in FIGS. 3A and 3B, the barrier layer 302 is made of a TiW material doped with Cu, AlCu or some other similar or like type of suitable copper material or copper alloy material, As shown in FIG. 3A, the barrier layer 302 includes a first portion 304, a second portion 306 that extends from a surface 308 at the first portion 304, and third portion 310 that extends from the second portion 306. The surface 308 may be a central surface as the first portion 304 may be a central portion of the barrier layer 302. The second and third portions 306, 310, respectively, may be portions of a peripheral portion of the barrier layer 302 that extends around the first portion 304 of the barrier layer 302. The second portion 306 extends around the first portion 304 and the third portion 310 extends around the first and second portions 304, 306. The second portion 306 is transverse to the first and third portions 304, 310, respectively, and the second portion 306 extends from the first portion 304 to the third portion 310 to connect the first portion 304 to the third portion 310. As shown in FIG. 3A, the barrier layer 302 completely and entirely covers the surface 280 of the first conductive layer 244 in a similar fashion as the barrier layer 230 in FIG. 2A completely and entirely covers the surface 280 of the first conductive layer 244. The barrier layer 302 includes ends present on the surface 268 of the third insulating layer 228 and covered by a sixth insulating layer 329. In some embodiments, the sixth insulating layer 329 may be a Silicon Nitride (SiN) layer. In some embodiments, the third insulating layer 228 may be a Silicon Nitride (SiN) layer. In some embodiments, when both the third insulating layer 228 and the sixth insulating layer 329 are both SiN layers, the sixth insulating layer 329 may become uniform or unitary with the third insulating layer 228 when the sixth insulating layer 329 is formed on the third insulating layer 228. The ends of the barrier layer 302 may be ends at which the barrier layer 302 terminates on the surface 268 of the third insulating layer 228. For example, the barrier layer 302 includes a first end on the left-hand side of the conductive structure 201 based on the orientation as shown in FIG. 3A, and the barrier layer 302 includes a second end on the right-hand side of the conductive structure 201 based on the orientation as shown in FIG. 3A.

The conductive structure 201 is coupled to the surface 308 of the barrier layer 302. A first sidewall 312 of the barrier layer 302 is opposite to a second sidewall 314 of the barrier layer 302. The first and second sidewalls 312, 314 extend from the surface 280 of the first conductive layer 244 to the third portion 310 of the barrier layer 302. When the barrier layer 302 is cylindrical in size and shape, the first and second sidewalls 312, 314 may be portions of a continuous sidewall of the barrier layer 302.

For example, when the barrier layer 302 is a TiW layer that is doped with a copper material (e.g., Cu, pure Cu, AlCu, etc.), the conductive structure 201 may be made of Nickel Palladium (NiPd) and the copper material doped within the TiW barrier layer 230 further facilitates or enables the forming of the NiPd conductive structure 201 on the TiW barrier layer 302 doped with the copper material when utilizing, for example, an electroless deposition technique known within the semiconductor industry. However, while the copper material doped within the TiW barrier layer 302 may further facilitate or enable forming the NiPd conductive structure 201 on the barrier layer 302 through, for example, electroless deposition, the TiW barrier layer 302 is doped with a only small or trace amount of the copper material (e.g., Cu, AlCu, or some other similar or like type of suitable copper material or copper alloy material) such that any minor corrosion that may occur near or at the surface 308 when forming the conductive structure 201 cannot reach or propagate within respective conductive layers (e.g., the first conductive layer 244) covered by the TiW barrier layer 302 doped with the small or trace amounts of the copper material within the structure 300. In other words, while the small or trace amount of copper material dopant is present and doped within the TiW barrier layer 230, there is only enough to further facilitate or enable formation of the conductive structure 201 through, for example, electroless deposition while not enough to result in propagation of corrosion throughout the structure 200 such as in the first conductive layer 244.

A sixth dimension 316 extends from the first sidewall 312 of the barrier layer 302 to the second sidewall 314 of the barrier layer 302. The first sidewall 312 of the barrier layer 302 is substantially coplanar and flush with the first sidewall 248 of the first conductive layer 244, and the second sidewall 314 of the barrier layer 302 is substantially coplanar and flush with the second sidewall 250 of the first conductive layer 244. In the embodiment of the structure 300 as shown in FIG. 3A, the sixth dimension 316 is substantially equal to the fourth dimension 252 of the first conductive layer 244 such that the barrier layer 302 completely and entirely covers the surface 280 of the first conductive layer 244. However, in some embodiments of the structure 300, the sixth dimension 316 may be greater than the fourth dimension 252 such that the barrier layer 302 extends outward from the first and second sidewalls 248, 250 of the first conductive layer 244.

An internal surface 318 of the barrier layer 302 is opposite to the surface 308 of the barrier layer 302 to which the conductive structure 201 is coupled. The internal surface 318 is on and coupled to the surface 280 of the first conductive layer 244 such that the barrier layer 302 completely and entirely covers the surface 280 of the first conductive layer 244.

The barrier layer 302 includes a third sidewall 322 and a fourth sidewall 324 opposite to the third sidewall 322, and the third sidewall 322 faces towards the fourth sidewall 324. As shown in FIG. 3A, the second and third portions 306, 310 are enclosed within the first, second, third, and sixth insulating layers 224, 226, 228, 329. For example, the first, second, and third insulating layers 224, 226, 228 are on and cover the first and second sidewalls 312, 314, the third portion 310 is on the second surface 268 of the third insulating layer 228, and the sixth insulating layer 329 covers the third portion 310. The sixth insulating layer 329 extends along the third portion 310 to the third and fourth sidewalls 322, 324 of the barrier layer 302, covers the third and fourth sidewalls 322, 324 of the barrier layer 302, and extends to the surface 308 of the barrier layer 302. The third and fourth sidewalls 322, 324 are transverse to the surface 308 of the barrier layer 302. The third and fourth sidewalls 322, 324 extend from the surface 308 towards a third surface 331 of the sixth insulating layer 329. The sixth insulating layer 329 includes a first sidewall 326 and a second sidewall 328 that both extend from the third surface 331 of the sixth insulating layer 329 to the surface 308 of the barrier layer 302. The first and second sidewalls 326, 328 of the sixth insulating layer 329 are transverse to the third surface 331 and the surface 308 of the barrier layer 302.

A crevice 330 of the structure 300 as shown in FIGS. 3A and 3B is the same or similar to the crevice 260 of the structure 200 as shown in FIGS. 2A and 2B. However, unlike the crevice 260 as shown in FIG. 2A, the crevice 330 as shown in FIG. 3A extends between the first sidewall 326 of the sixth insulating layer 329 and the first sidewall 208 of the conductive structure 201, and the crevice 330 extends between the second sidewall 328 of the sixth insulating layer 329 and the second sidewall 210 of the conductive structure 201.

The crevice 330 further includes an opening 332, which is the same or similar to the opening 262 of the crevice 260 as shown in FIGS. 2A and 2B. However, unlike the opening 262 of the crevice 260 as shown in FIG. 2A, the opening 332 of the crevice 330 as shown in FIG. 3A extends from the third surface 331 of the sixth insulating layer 329 to the first surface 266 of the conductive structure 201.

The barrier layer 302 completely and entirely separates the crevice 330 from the first conductive layer 244. Accordingly, while contaminants (e.g., debris, gasses, liquids, fluids, moisture, etc.) may enter the opening 332 and pass through the crevice 330 to the surface 308 of the barrier layer 302, the contaminants (e.g., debris, gasses, liquids, fluids, moisture, etc.) cannot travel to or reach the first conductive layer 244 (e.g., cannot reach the surface 280 of the first conductive layer 244). This prevents the first conductive layer 244 from being exposed to the contaminants (e.g., debris, gasses, liquids, fluids, moisture, etc.) and reduces the likelihood of the first conductive layer 244 being corroded by the contaminants (e.g., debris, gasses, liquids, fluids, moisture, etc.) while allowing the crevice 330 to be present to reduce the likelihood of mechanical issues with respect to at least the first, second, third, and sixth insulating layers 224, 226, 228, 329 and the conductive structure 201.

FIG. 3B is a zoomed in view of section 3B-3B as shown in FIG. 3A. As shown in FIG. 3B, the first portion 304, which may be a central portion, of the barrier layer 302 has a first thickness 334 that extends from the internal surface 318 of the barrier layer 302 to the surface 308 of the barrier layer 302 coupled to the conductive structure 201. The second portion 306 includes a second thickness 336 that extends from the first sidewall 312 of the barrier layer 302 to the third sidewall 322 of the barrier layer 302. The third portion 310 includes the second thickness 336. In this embodiment of the structure 300 as shown in FIG. 3B, the first thickness 334 is larger than the second thickness 336. However, in some embodiments, the first thickness 334 may be equal to the second thickness 336, and, in some embodiments, the first thickness 334 may be less than the second thickness 336.

Figure 4A:
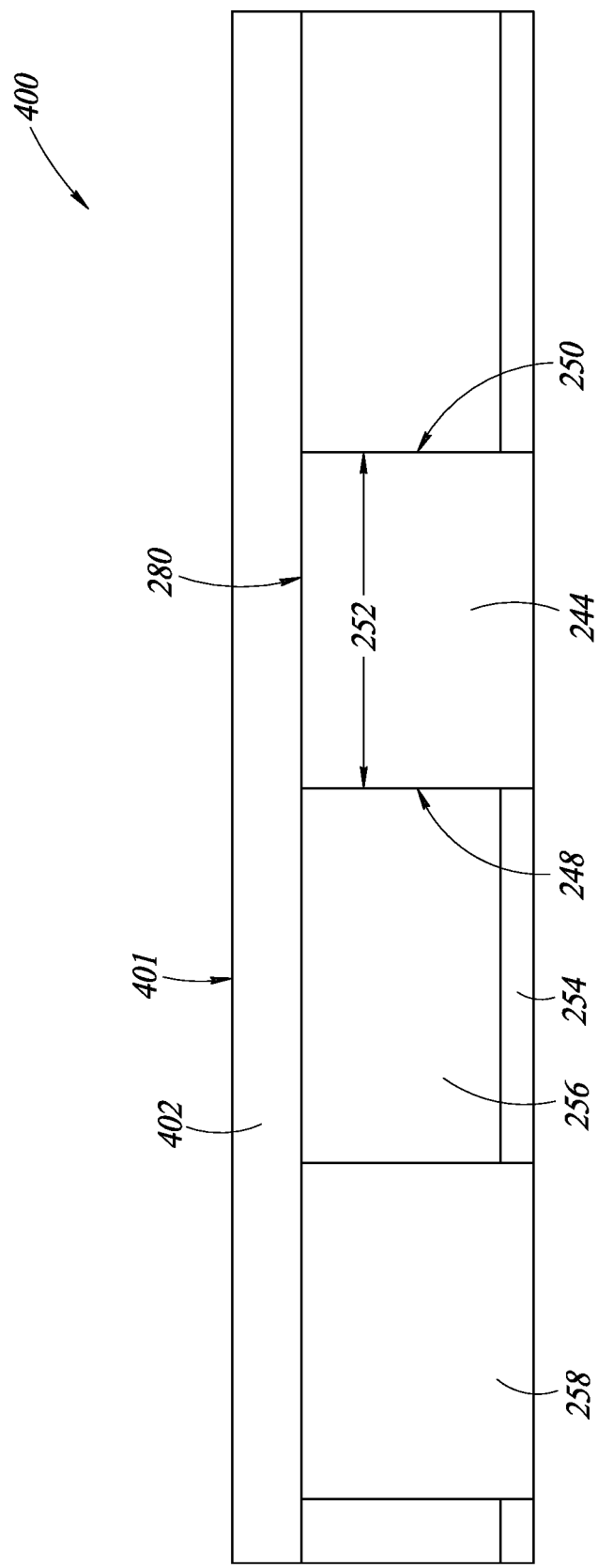
FIGS. 4A-4E are cross-sectional views of an embodiment of a method of manufacturing the embodiment of the conductive structure of the semiconductor package as shown in FIGS. 2A and 2B.

FIGS. 4A-4E are directed to cross-sectional views of an embodiment of a method of manufacturing the embodiment of the structure 200 as shown in FIGS. 2A and 2B of the present disclosure. FIG. 4A is a cross-sectional view of a structure 400 including the first conductive layer 244, the second conductive layer 258, the fourth insulating layer 254, the fifth insulating layer 256, and a layer of barrier material 402 that is on and covers surfaces of the second conductive layer 258, the fifth insulating layer 256, and the surface 280 of the first conductive layer 244. The layer of barrier material 402 may be formed on these respective surfaces utilizing a deposition technique. For example, the deposition technique may be a chemical vapor deposition technique, a physical vapor deposition technique, or some other similar or like type of deposition technique for forming the layer of barrier material 402 on these respective surfaces as shown in FIG. 4A. The layer of the barrier material 402 includes a surface 401 that faces away from the fourth insulating layer 254, the fifth insulating layer 256, the first conductive layer 244, and the second conductive layer 258.

For example, when a chemical vapor deposition technique is utilized, the layer of barrier material 402 may be formed by exposing the respective surfaces of the first conductive layer 244, the second conductive layer 258, and the fifth insulating layer 256 to one or more volatile precursors (e.g., chemicals). After being exposed to these volatile precursors, which were previously deposited on these respective surfaces of the first conductive layer 244, the second conductive layer 258, and the fifth insulating layer 256, the volatile precursors react or decompose after being deposited on these respective surfaces resulting in the formation of the layer of the barrier material 402 on these respective surfaces. As shown in FIG. 4A, the layer of the barrier material 402 is formed to cover these respective surfaces of the first conductive layer 244, the second conductive layer 258, and the fifth insulating layer 256, and the layer of barrier material 402 is also formed to include the surface 401 that faces away from these respective surfaces of the first conductive layer 244, the second conductive layer 258, and the fifth insulating layer 256.

For example, the layer of barrier material 402 may be a titanium tungsten (TiW) based material that is doped with a small amount of a copper material (e.g., Cu, pure Cu, AlCu, etc.). When the barrier material 402 is made of the TiW based material doped with the small or trace amounts of the copper material, a conductive material (e.g., nickel) may be more readily grown on the layer of barrier material 402, for example, when carrying out an electroless plating technique or electroless conductive structure formation technique to form a conductive structure 201 (see, for example, the detailed discussion of FIG. 4E later within the present disclosure). For the purposes of the following discussion with respect to FIGS. 4A-4E, the barrier material 402 is the TiW base material that is doped with the small or trace amounts of the copper material or copper alloy material as the barrier material 402 will eventually become the barrier layer 230 as discussed earlier herein with respect to the structure 200 as shown in FIGS. 2A and 2B.

Figure 4B:
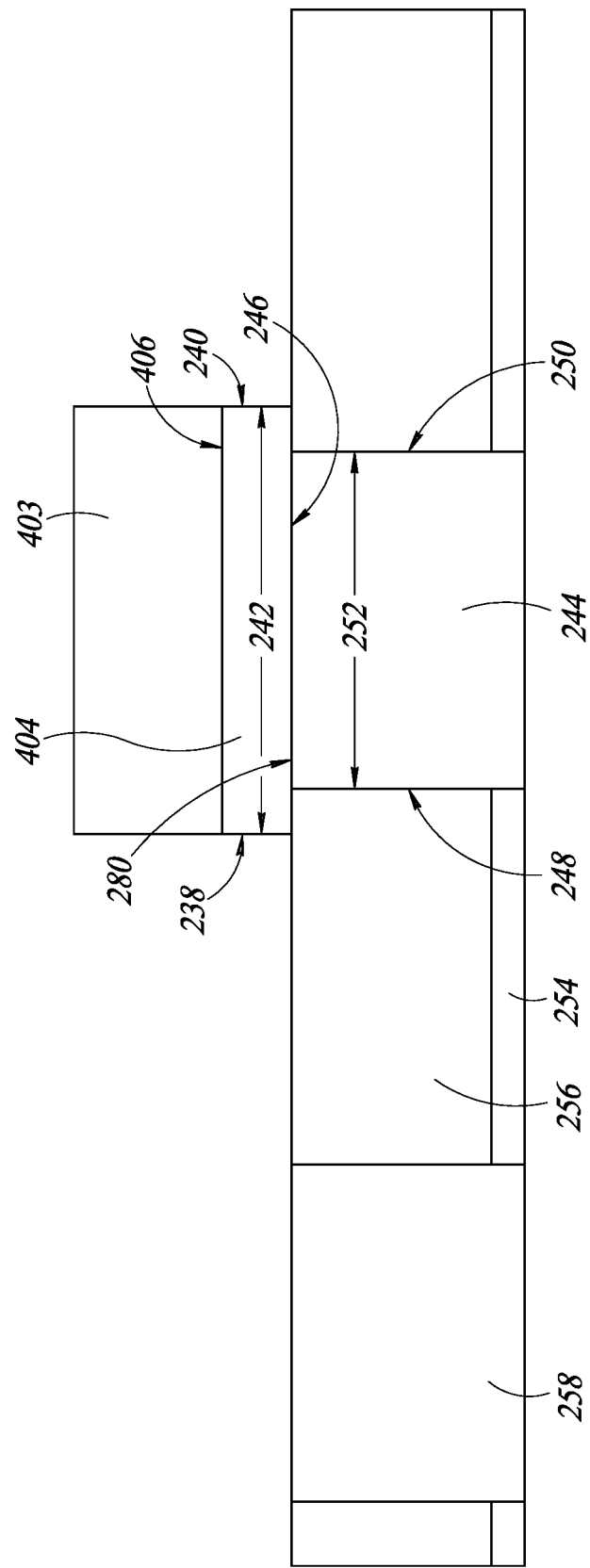

After the layer of barrier material 402 is formed as shown in FIG. 4A, the layer of barrier material 402 is patterned or etched to form a portion of the barrier material 404 that entirely and completely covers the surface 280 of the first conductive layer 244 as shown in FIG. 4B. For example, in at least one embodiment of the method of forming the structure 200, a resist layer 403 is formed on an area of the surface 401 of the layer of the barrier material 402 corresponding to the portion of the barrier material 404. In other words, the resist layer 403, which is a temporary and sacrificial layer to be removed later, is formed to completely and entirely overlap the surface 280 of the first conductive layer 244.

After the resist layer 403 is formed on the surface 401, an etching technique (e.g., wet etching, dry etching, etc.) is carried out to remove the layer of barrier material 402 that is not covered by the resist layer 403 as shown in FIG. 4B. This etching of the layer of the barrier material 402 forms the portion of the barrier material 404 and forms the first sidewall 238 and the second sidewall 240 of the portion of the barrier material 404. The portion of the barrier material 404 is further processed and refined in the following steps to be discussed herein to form the barrier layer 230 as shown in FIG. 2A. The first and second sidewalls 238, 240 of the portion of the barrier material 404 are spaced outwardly from the respective sidewalls 248, 250 of the first conductive layer 244 similar to the first and second sidewalls 238, 240 of the barrier layer 230 as shown in FIG. 2A are spaced outwardly relative to the respective sidewalls of the first conductive layer 244 as shown in FIG. 2A. The portion of the barrier material 404 includes the third dimension 242 as well.

Figure 4C:
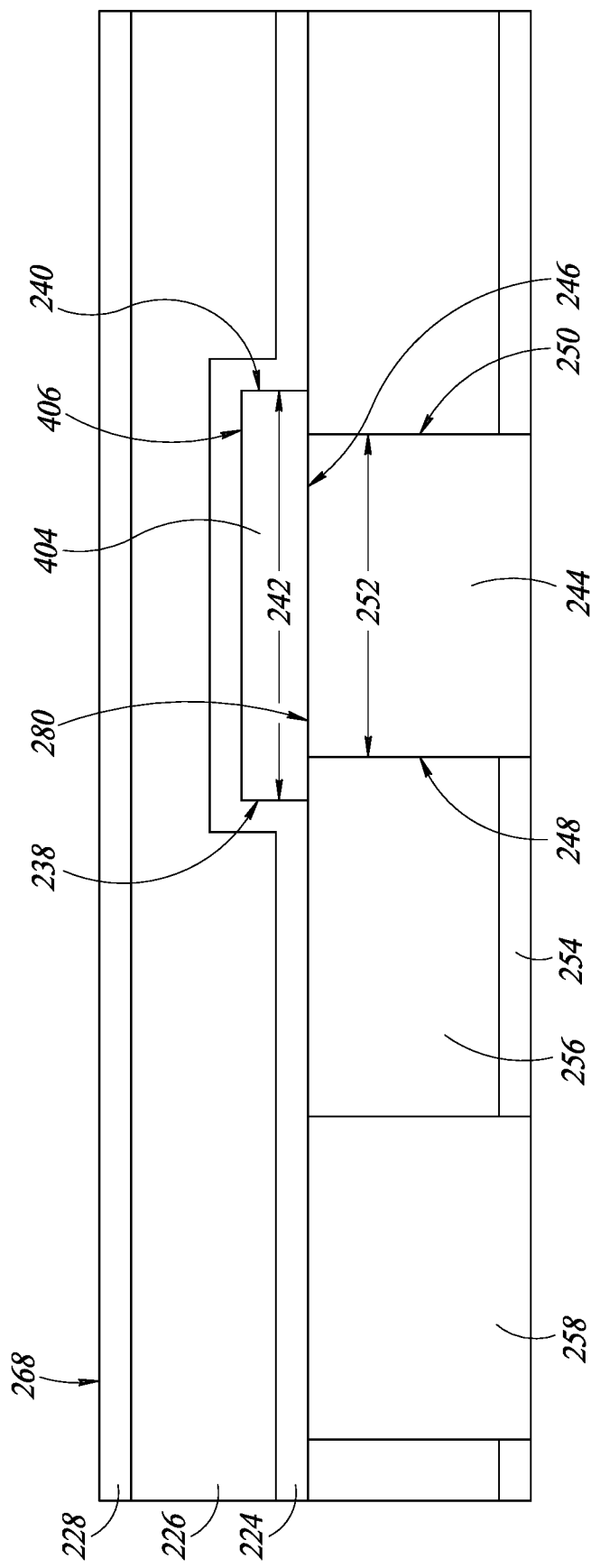

After the portion of the barrier material 404 has been formed by utilizing the resist layer 403 and performing the etching technique as discussed with respect to FIG. 4B, the resist layer 403 is removed from the portion of the barrier material 404 as shown in FIG. 4C. For example, the resist layer 403 may be removed from a surface 406, which is part of the surface 401, of the portion of barrier material 404 by exposing the resist layer 403 to a light source or a chemical that results in the resist layer 403 decomposing or dissolving. This removes the resist layer 403 from the surface 406 of the portion of barrier material 404 and exposes the surface 406 of the portion of barrier material 404.

After the resist layer 403 is removed, the first, second, and third insulating layers 224, 226, 228 are formed on the second conductive layer 258, the fifth insulating layer 256, and the portion of the barrier material 404 as shown in FIG. 4C. The first, second, and third insulating layers 224, 226, 228 may be formed by performing multiple depositions techniques successively to form the first, second, and third insulating layers 224, 226, 228 in a stacked configuration based on the orientation as shown in FIG. 4C. These deposition techniques may include chemical vapor deposition techniques, physical vapor deposition techniques, or some other similar or like type of deposition technique for forming the first, second, and third insulating layers 224, 226, 228 as shown in FIG. 4B. The first insulating layer 224 covers the first and second sidewalls 238, 240 of the portion of the barrier material 404, and the first insulating layer covers the surface 406 of the portion of barrier material 404 that extends from the first sidewall 238 to the second sidewall 240.

Figure 4D:
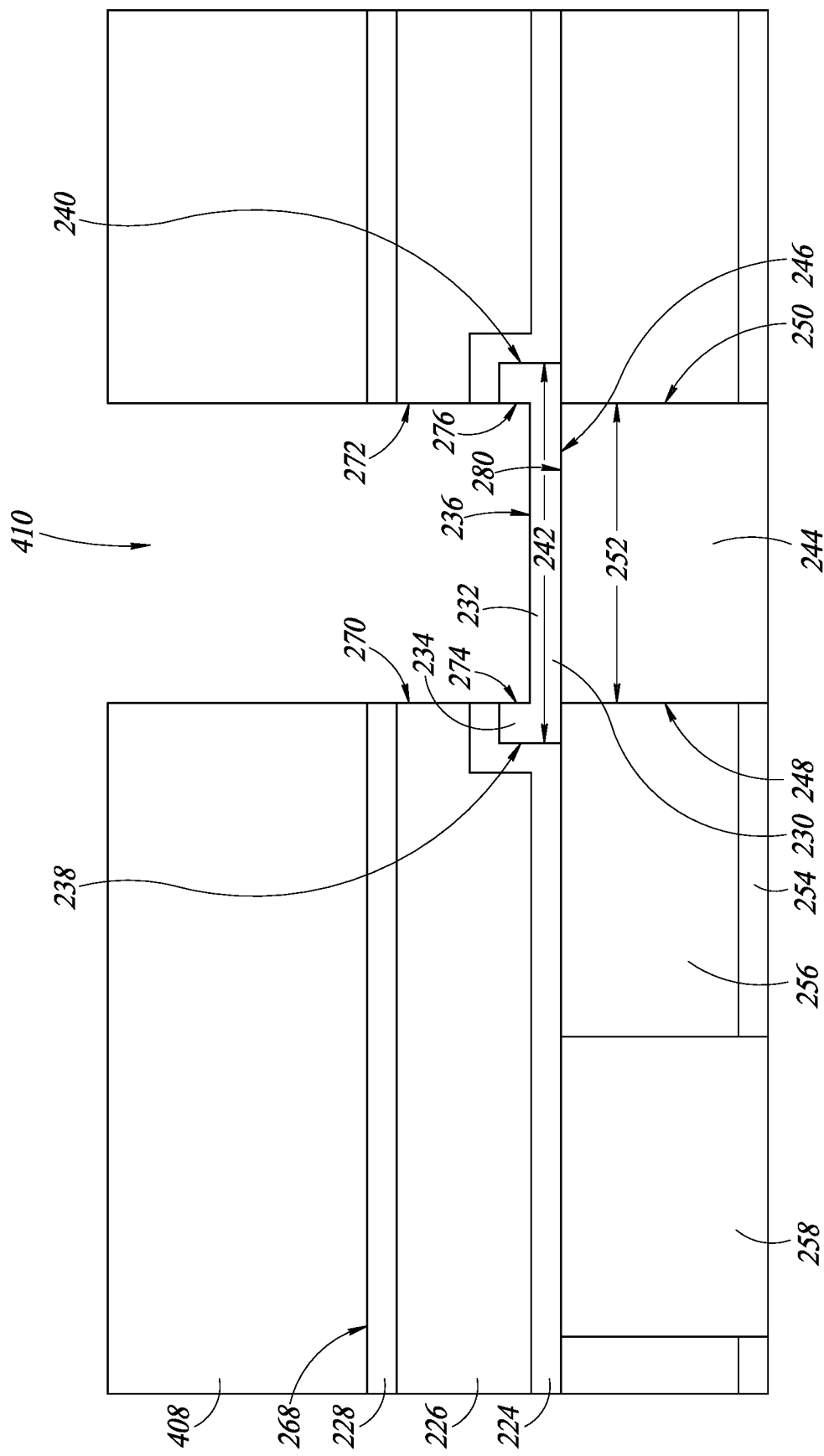

After the first, second, and third insulating layers 224, 226, 228 have been formed as shown in FIG. 4C, a resist layer 408, which is a temporary and sacrificial layer, is formed on the second surface 268 of the third insulating layer 228 such that a recess 410 may be formed as shown in FIG. 4D. The recess 410 is formed to extend into and through the resist layer 408 and the first, second, and third insulating layers 224, 226, 228, respectively, to the portion of barrier material 404 as shown in FIG. 4D. Forming the recess 410 results in forming the recessed surface 236 of the portion of the barrier material 404 such that the portion of the barrier material 404 now has the structure of the barrier layer 230 as shown in FIG. 2A.

The recess 410 may be formed by an etching technique (e.g., wet etching, dry etching, etc.). For example, an etchant (e.g., a chemical) is introduced into an opening that was previously patterned into the resist layer 408 that corresponds to the location at which the recess 410 is to be formed extending through the first, second, and third insulating layers 224, 226, 228. The etchant introduced into the opening within the resist layer 408 exposes the first, second, and third insulating layers 224, 226, 228 to the etchant. This etchant then dissolves or decomposes respective portions of the first, second, and third insulating layers 224, 226, 228 forming the recess 410 as shown in FIG. 4D extending into and through the first, second, and third insulating layers 224, 226, 228, respectively. The recessed surface 236 may be formed concurrently with the recess 410 as the etchant introduced through the opening in the resist layer 408 to form the recess 410 exposes the surface 406 of the portion of barrier material 404 to the etchant, and, accordingly, the etchant also removes a respective portion of the portion of the barrier material 404 forming the recessed surface 236. Forming the recessed surface 236 also results in the formation of the central portion 232, the peripheral portion 234, and the raised surface 286 as shown in FIGS. 2A and 2B, respectively, of the barrier layer 230 in the structure 200. In other words, after this etching technique is carried out as shown in FIG. 4D, the barrier layer 230 as shown in FIGS. 2A and 2B is formed.

Figure 4E:
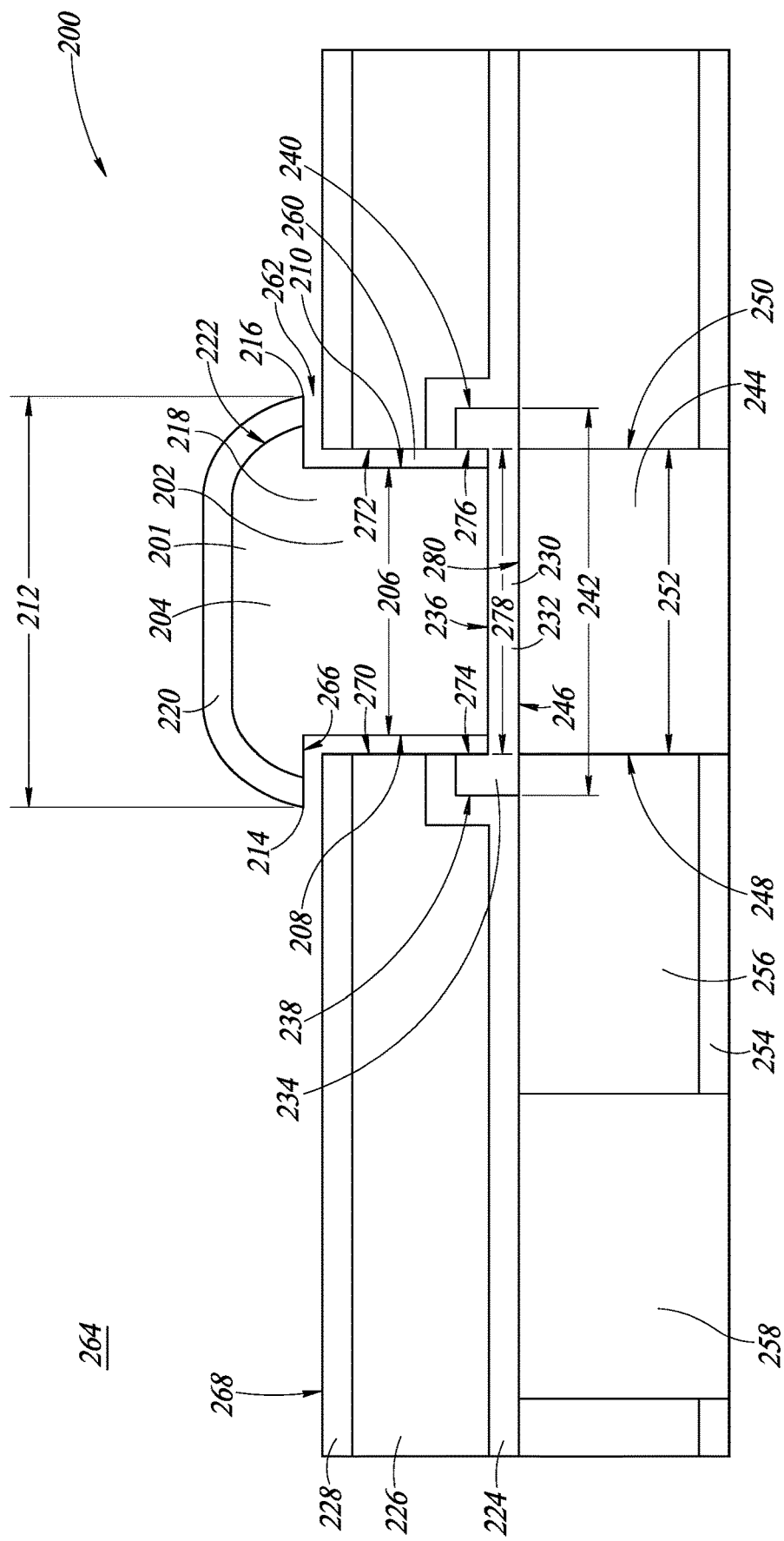

After the recess 410 is formed as shown in FIG. 4D, the resist layer 408 is removed and the conductive structure 201 is formed within the recess 410 present within the first, second, and third insulating layers 224, 226, 228, and is formed on the recessed surface 236 as shown in FIG. 4E. The conductive structure 201 may be formed by multiple successive patterning steps that include multiple etching techniques (e.g., wet etching, dry etching, etc.) and multiple deposition techniques (e.g., sputtering, ion beam deposition, conductive material growth, electroless deposition, etc.) that are utilized to form the conductive structure 201 as shown in FIG. 4E. Forming the conductive structure while performing the multiple patterning steps results in the formation of the crevice 260 as well. For example, when the deposition steps or step is an electroless deposition technique, the conductive material deposited to form the conductive structure 201 does not adhere to the respective sidewalls 270, 272 such that the crevice 260 is formed. This electroless deposition technique may be a wet chemical process that utilizes a chemical in liquid or fluid form. For example, when the first conductive material 218 of the conductive structure 201 is a nickel (Ni) material, an electroless nickel plating process is carried out such that nickel material is grown on the recessed surface 236 of the barrier layer 230 by coating the recessed surface 236 with the nickel material through a chemical reduction. After the nickel material is grown on the recessed surface forming all of the first portion 202 and some of the second portion 204, the second conductive layer 220 is formed on the surface 222. For example, when the second conductive layer 220 is a palladium material, the palladium material may be formed through an electroplating process to form and couple the palladium material on and to the nickel material.

However, when and as the barrier layer 230 in FIGS. 4D and 4E is made of the titanium tungsten (TiW) based material doped with the copper material (e.g., Cu alloy, pure Cu, AlCu, etc.), the nickel material of the conductive structure 201 may be more readily grown on the barrier layer 230 through an electroless deposition technique known to the semiconductor industry. For example, the nickel material more readily be grown, be formed on, or be deposited on the barrier layer 230 as the copper material dopant within the TiW base material of the barrier layer 230 further facilitates or enables the forming of the conductive structure 201 by growing or depositing the nickel material on the barrier layer 230 through the electroless deposition technique known to the semiconductor industry. For example, if instead the barrier layer 230 was made only of titanium tungsten (TiW) that was not doped with the small or trace amounts of copper material, growing, forming, or depositing the nickel (Ni) material on the non-doped TiW material may be more difficult through the electroless deposition technique as the nickel material may not as readily be formed or attracted to the non-doped TiW material relative to the TiW material doped with the small or trace amounts of copper material or copper alloy material as utilized with respect to FIGS. 4A-4E in forming the structure 200. However, as discussed earlier herein, utilizing the barrier layer 230 made of the TiW material doped with the small or trace amounts of copper material (e.g., Cu alloy, pure Cu, AlCu, etc.) results in the nickel material more readily growing and forming on the recessed surface 236 as the nickel material is more readily attracted to the recessed surface 236 due to the presence of the dopant copper material or copper alloy material in the TiW material. As discussed earlier herein, while the small or trace amount of dopants of the copper material within the TiW material of the barrier layer 230 may be slightly susceptible to corrosion, there is only small or trace amounts of the dopants of the copper material or copper alloy material within the TiW material such that even if some corrosion occurs or propagates within the barrier layer 230 due to the presence of the small or trace amounts of dopants of the copper material or copper alloy material, this corrosion that occurs at the recessed surface 236 due to being exposed to contaminants that may readily pass through the crevice 260 by entering through the opening 260 will be minimized or mitigated and will not reach or result in corrosion propagating within the first conductive layer 244 as the barrier layer 230 protects or prevents this corrosion from reaching the conductive layer 244. In view of the above discussion, the small or trace amounts of dopant of the copper material or copper alloy material within the TiW material of the barrier layer 230 may act in a same or similar fashion to a seed layer as known within the semiconductor industry to further facilitate or enable the growing or forming of the nickel material of the conductive structure 201 on the recessed surface 236 of the barrier layer 230, for example, through an electroless deposition technique known to the semiconductor industry.

After the conductive structure 201 is formed, the crevice 260 is also formed as well such that the crevice 260 separates the respective sidewalls and surfaces of the conductive structure 201 from the respective surfaces and sidewalls of the first, second, and third insulating layers 224, 226, 228. After the conductive structure 201 is formed, the structure 200 is formed as shown in FIG. 2A, which is also reproduced in FIG. 4E for purposes of showing the complete method of forming the structure 200 as shown in FIGS. 2A and 4E of the present disclosure.

Figure 5A:
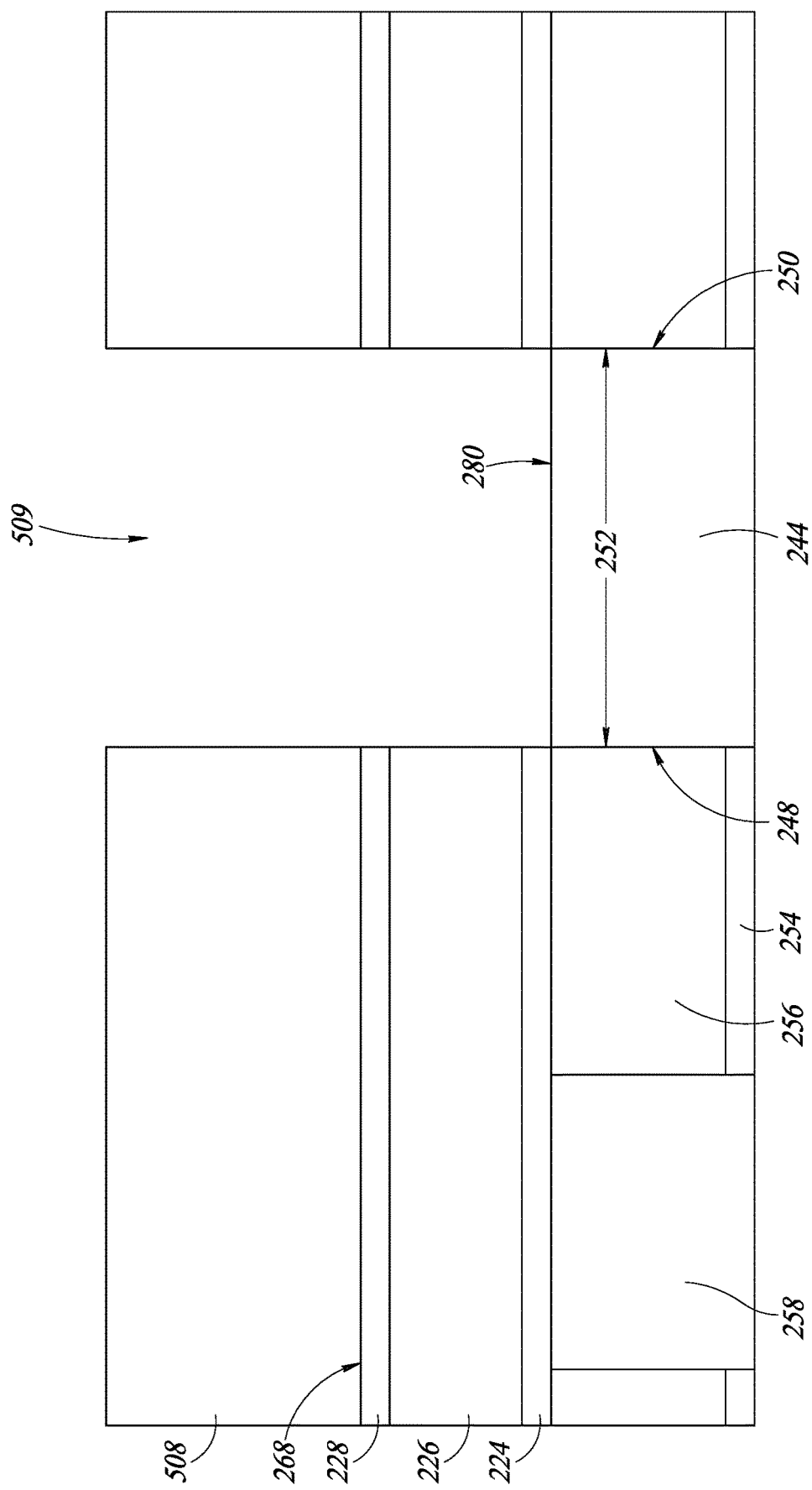
FIGS. 5A-5E are cross-sectional views of an embodiment of a method of manufacturing the alternative embodiment of the conductive structure of the semiconductor package as shown in FIGS. 3A and 3B.

FIGS. 5A-5E are directed to cross-sectional views of an embodiment of a method of manufacturing the embodiment of the structure 300 as shown in FIGS. 3A and 3B of the present disclosure. As shown in FIG. 5A, a similar process is carried out up to FIG. 4C as discussed earlier herein with respect to the method of forming the structure 200 as shown in FIGS. 2A and 2B. However, unlike FIG. 4C in which the first, second, and third insulating layers 224, 226, 228 are formed on the portion of barrier material 404, the portion of barrier material 404 was not previously formed such that the portion of barrier material 404 is not present in FIG. 5A in the method of manufacturing the structure 300.

In view of the portion of barrier material 404 not being present as shown in FIG. 5A, a resist layer 508 is formed and patterned with an opening that is utilized to form a recess 509 as shown in FIG. 5A. The recess 509 is formed to extend entirely and completely through the first, second, and third insulating layers 224, 226, 228 to the surface 280 of the first conductive layer 244 as the portion of barrier material 404 is not present in FIG. 5A. The resist layer 508 as shown in FIG. 4D may be formed and patterned with the opening in the same or similar fashion as discussed above with respect to forming the resist layer 408. The recess 509 as shown in FIG. 5D may be formed in the same or similar fashion as discussed above with respect to forming the recess 410.

Figure 5B:
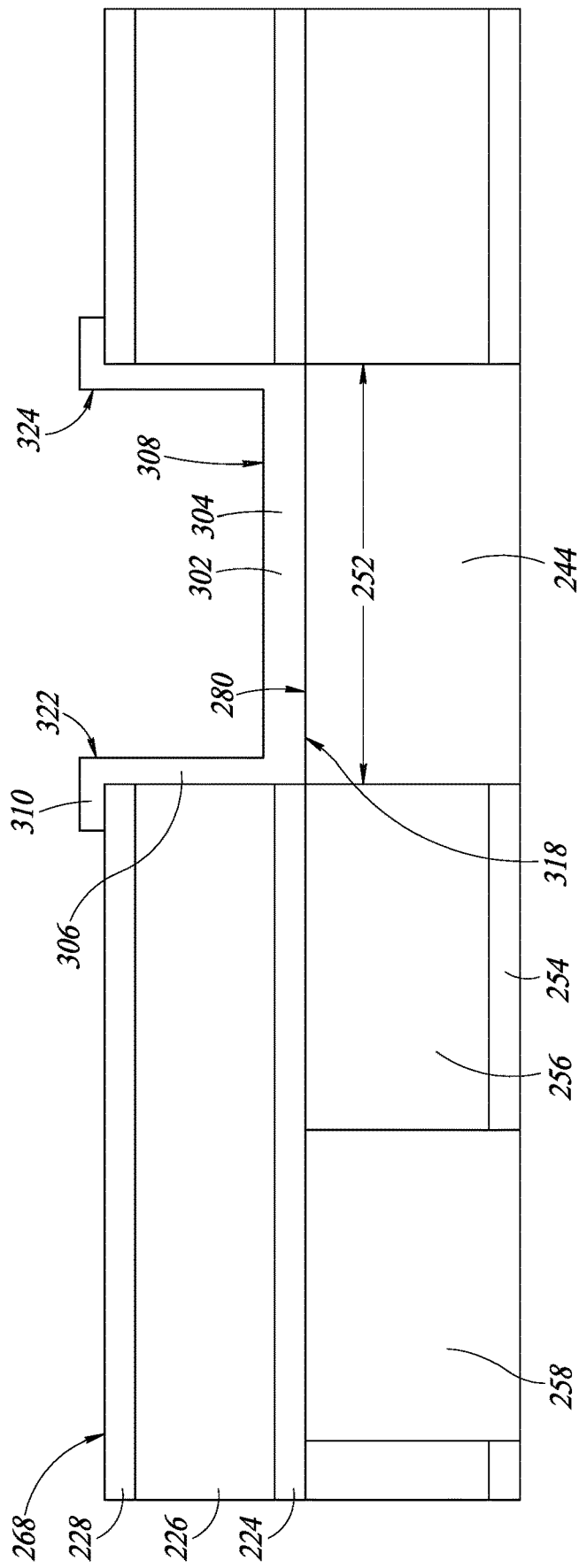
Figure 5C:
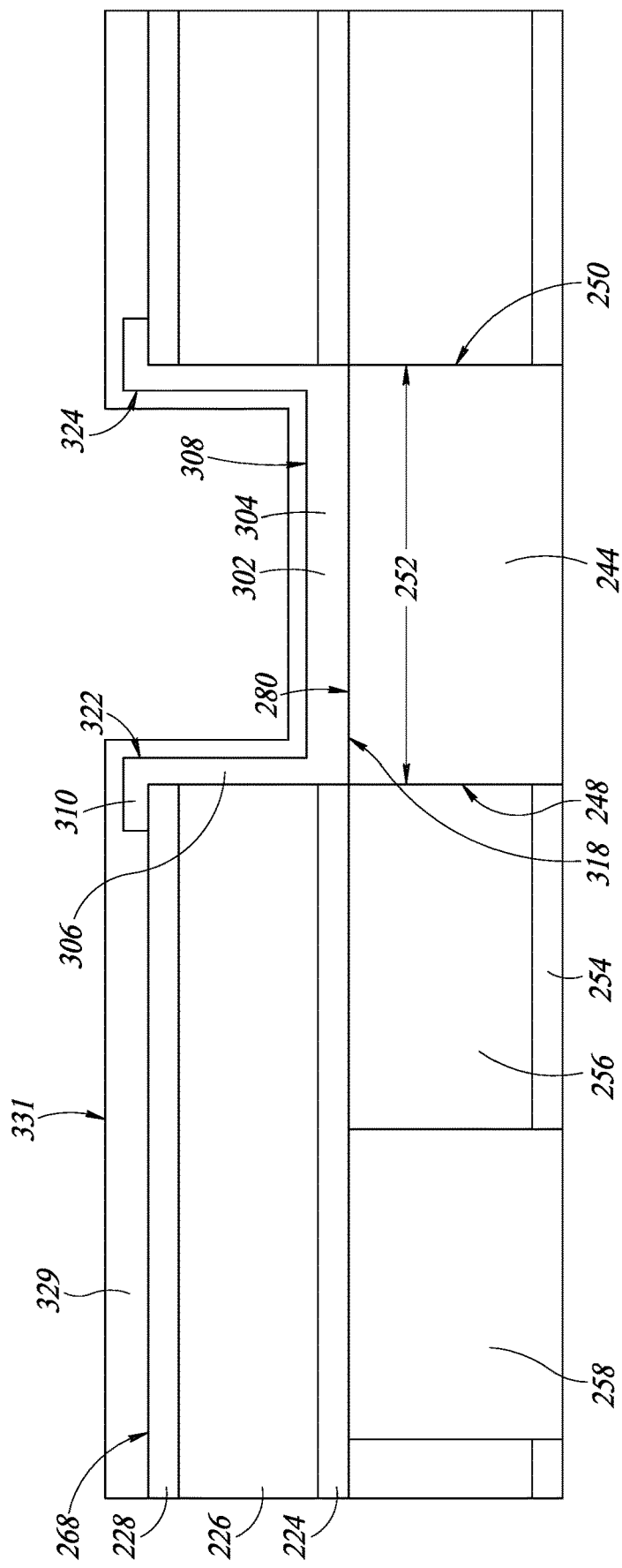

After the recess 509 is formed extending into and through the first, second, and third insulating layers 224, 226, 228 as shown in FIG. 5A to the surface 280 of the first conductive layer 244, the barrier layer 302 is formed as shown in FIG. 5B. The barrier layer 302 may be formed by forming a barrier material extending along the second surface 268 of the third insulating layer 228 and within the recess 509. After the barrier material is formed along the second surface 268 and within the recess 509, another resist layer, which is temporary and sacrificial, may be formed and patterned such that the resist layer only covers the portion of the barrier material corresponding to the barrier layer 302. The barrier material is then patterned to remove portions of the barrier material that do not correspond to the barrier layer 302. For example, these portions of the barrier material may be removed with an etching technique (e.g., wet etching, dry etching, etc.). After this etching technique is carried out to remove the respective portions of the barrier material that do not correspond to the barrier layer 302, the resist layer (not shown) is removed from the barrier layer 302 exposing the barrier layer 302 as shown in FIG. 5B. For the purposes of the following discussion with respect to FIGS. 5B-5D, the barrier layer 302 is made of a TiW material doped with a small or trace amounts of copper material or copper alloy material.

After the barrier layer 302 is formed as shown in FIG. 5B, the sixth insulating layer 329 is formed on the second surface 268 of the third insulating layer 228, on the surface 308 of the barrier layer 302, and on the third and fourth sidewalls 322, 324 of the barrier layer 302. In other words, the sixth insulating layer 329 is formed to cover the second surface 268 of the third insulating layer 228, the surface 308 of the barrier layer 302, and the third and fourth sidewalls 322, 324 of the barrier layer 302. The sixth insulating layer 329 may be formed by a passivation process (e.g., microcoating application process, chemical passivation layer formation technique, oxidation passivation process, etc.) or some other similar or like type of insulating layer formation technique or process.

Figure 5D:
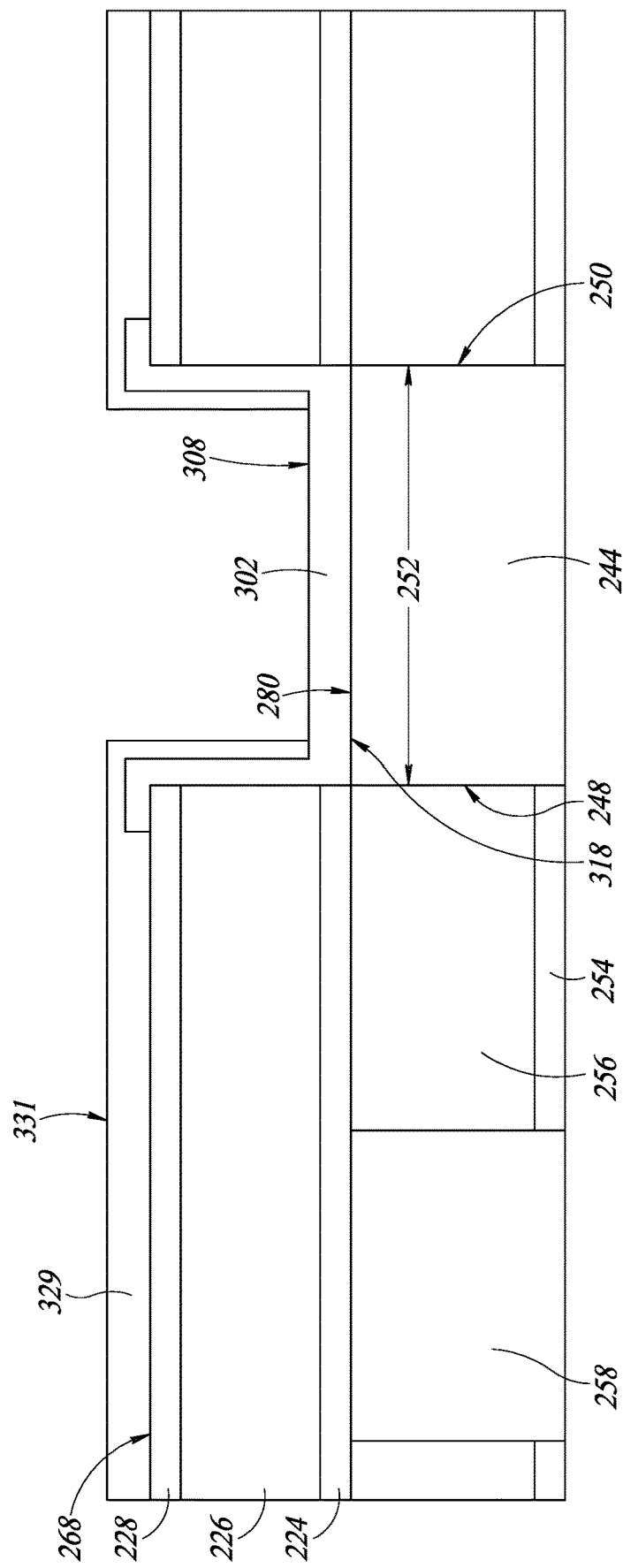

After the sixth insulating layer 329 is formed, a portion of the sixth insulating layer 329 is removed to expose the surface 308 of the barrier layer 302 as shown in FIG. 5D. The portion of the sixth insulating layer 329 may be removed by forming a resist layer on the sixth insulating layer 329, patterning the resist layer to expose the portion of the sixth insulating layer 329 to be removed, and exposing the surface 308 of the barrier layer 302 by removing the portion of the sixth insulating layer 329 overlapping the surface 308. The portion of the sixth insulating layer 329 covering the surface 308 of the barrier layer 302 may be removed by patterning an opening in the resist layer overlapping the portion of the sixth insulating layer 329 covering the surface 308, and introducing an etchant through the opening in the resist layer to the portion of the sixth insulating layer covering the surface 308. The etchant then removes or dissolves the portion of the sixth insulating layer 329 exposing the surface 308 of the barrier layer 302. After the surface 308 of the barrier layer 302 is exposed, the resist layer may be removed as well through a resist removal process similar to that discussed above with respect to removing the resist layer 403 as discussed earlier herein with respect to FIG. 4B. After the portion of the sixth insulating layer 329 is dissolved or removed, the surface 308 of the barrier layer 302 is exposed.

Figure 5E:
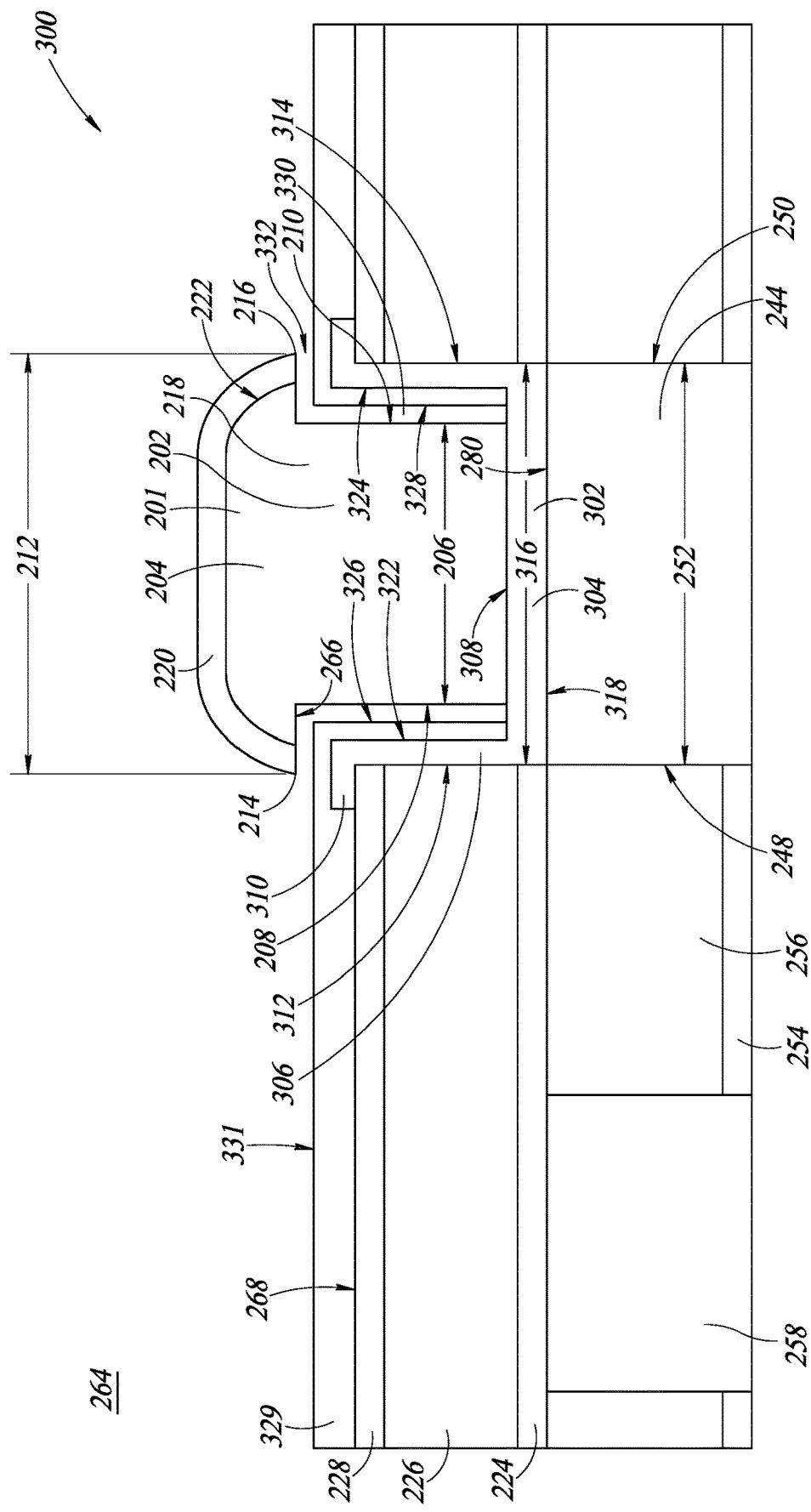

After the surface 308 of the barrier layer 302 has been exposed, the conductive structure 201 is formed on the surface 308 of the barrier layer 302 as shown in FIG. 5E. The conductive structure 201 as formed in FIG. 5E in the same or similar manner as discussed above with respect to forming the conductive structure 201 relative to FIG. 4E as discussed earlier within the present disclosure.

When and as the barrier layer 302 is made of the titanium tungsten (TiW) based material doped with the copper material or copper alloy material (e.g., Cu, AlCu, or some other similar or like type of suitable copper material or copper alloy material), the nickel material of the conductive structure 201 may be more readily grown on the barrier layer 230 as the copper material dopant or copper alloy material dopant within the TiW material further facilitates or enables forming or growing of the nickel material of the conductive structure 201 on the surface 308 of the barrier layer 302. For example, if instead the barrier layer 302 was made only of titanium tungsten that was not doped with the small or trace amounts of copper material, growing or forming the nickel (Ni) material on the non-doped TiW material may be more difficult through an electroless deposition technique known within the semiconductor industry. However, utilizing the barrier layer 302 made of the TiW material doped with the copper material or copper alloy material (e.g., Cu, AlCu, etc.) results in the nickel material more readily growing and forming the surface 308 of the barrier layer 302 as the nickel material is more readily attracted to and formed on the surface 308 of the barrier layer 302 due to the presence of the dopant copper material or dopant copper alloy material in the TiW material of the barrier layer 302. For example, the nickel material may more readily adhere to dopants of the copper material near or at the surface 308 forming the nickel material of the conductive structure 201 on the surface 308 of the barrier layer 302 made of the TiW material doped with the copper material than if, instead, the barrier layer 302 were made only of the TiW material without any copper dopants. While the dopants of the copper or copper alloy material within the TiW material may be more susceptible to corrosion, there is only the small or trace amount of the dopants of the copper or copper alloy material within the TiW material such that even if some corrosion occurs or propagates within the barrier layer 302 due to the presence of the small amounts of dopants of the copper or copper alloy material, any of the corrosion that occurs at the surface 308 of the barrier layer 302 due to being exposed to contaminants that may readily pass through the crevice 330 by entering through the opening 332 will be minimized or mitigated and will not reach or result in corrosion propagating within the first conductive layer 244. In view of the above discussion, the dopant of the copper material within the TiW material of the barrier layer 302 may act the same or similar to a seed layer as known within the semiconductor industry to further facilitate or enable the growing or forming of the nickel material of the conductive structure 201 on the surface 308 of the barrier layer 302.

Figure 6:
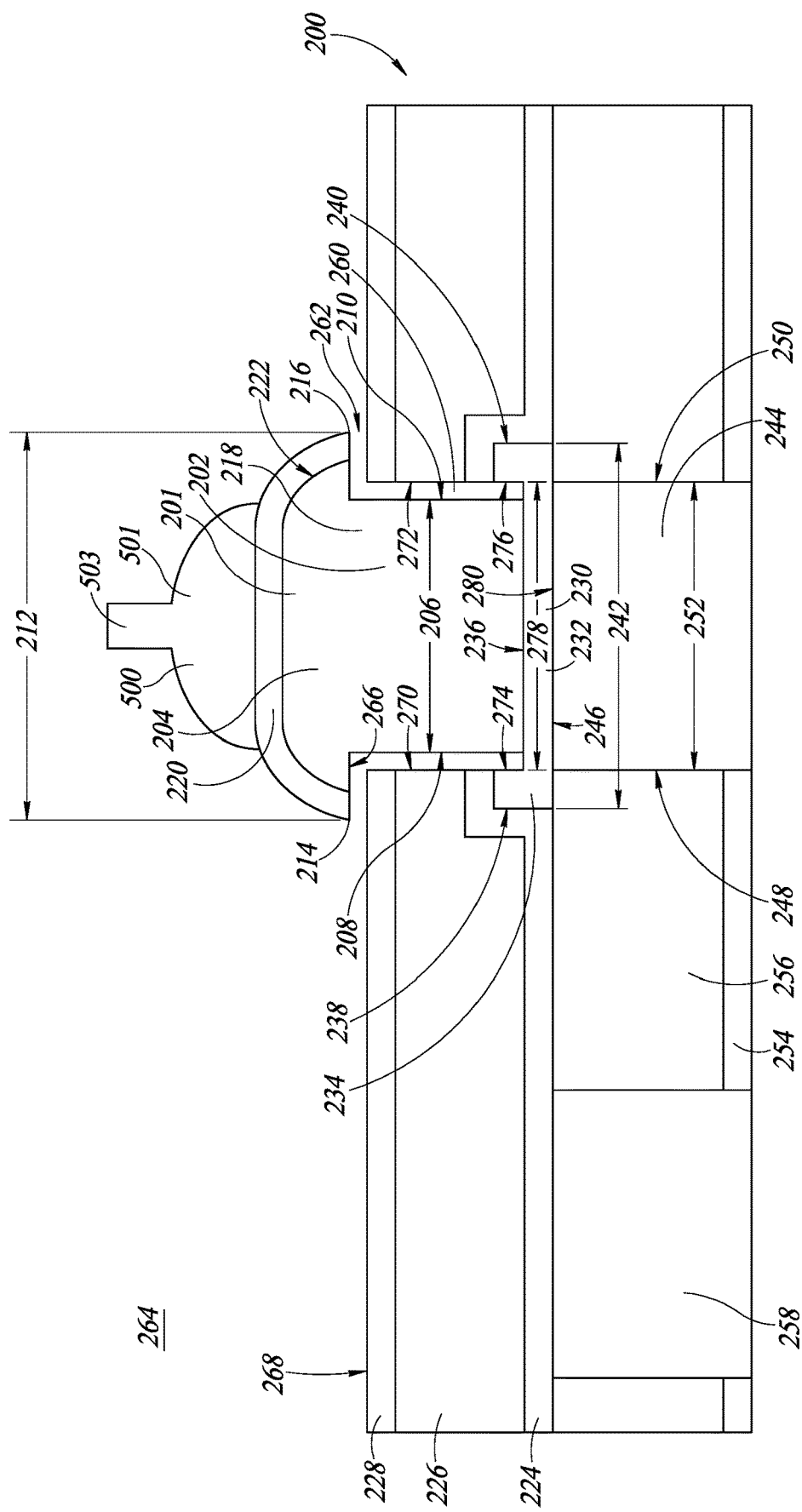
FIG. 6 is a cross-sectional view of the embodiment of the conductive structure as shown in FIGS. 2A and 2B coupled to a wire bond electrical connection.

FIG. 6 is a cross-sectional view of the structure 200 with a wire bond 500 coupled to the conductive structure 201. The wire bond 500 includes a ball 501 and a wire 503. The ball 501 is on and coupled to the second conductive layer 220 of the conductive structure 201, and the ball 501 is on and coupled to the second portion 204 of the conductive structure 201. The wire 503 extends away from the ball 501 and may be coupled to another conductive feature (e.g., conductive pad, lead, etc.) spaced apart from the conductive structure 201 as shown in FIG. 6. In other words, the wire bond 500 is formed to form an electrical pathway or connection to the conductive feature spaced apart from the conductive structure 201 such that electrical signals may be transmitted to and from the conductive structure 201 along the wire bond 500. For example, the electrical signal may be a control signal, a data signal, an interrupt signal, or some other similar or like type of electrical signal that may be transmitted to or from the conductive structure 201 such that an electrical device may readily perform an electrical function.

When forming the wire bond 500 to be coupled to the conductive structure 201 as shown in FIG. 6 with a wire bond formation technique (e.g., ball and stitch formation technique), the conductive structure 201 may expand due to being exposed to an increase in temperature as well as a compression force when applying the ball 501 to the second portion 204 of the conductive structure 201. For example, a capillary nozzle at an end of a capillary tube of a wire bond formation device, machine, or tool may be placed over the conductive structure 201 and may extrude a conductive material onto the second portion 204 of the conductive structure 201 to form the ball 501 of the wire bond 500. The conductive material extruded may be at a temperature higher than a temperature than that of the conductive structure. This exposure to the higher temperature results in the conductive structure 201 expanding into the crevice 260 as shown in FIG. 6. In other words, the crevice 260 provides clearance such that as the conductive structure 201 expands the conductive structure 201 does not contact the first, second, and third insulating layers 224, 226, 228. If the conductive structure 201 were to physically contact and press against the first, second, and third insulating layers 224, 226, 228, the pressure applied by the expansion of the conductive structure 201 onto the first, second, and third insulating layers 224, 226, 228 may result in mechanical issues propagating in at least one of the first insulating layer 224, second insulating layer 226, and third insulating layer 228, and the conductive structure 201. However, since the crevice 260 is provided, the conductive structure 201 does not contact the first, second, and third insulating layers 224, 226, 228 even when the conductive structure 201 is in an expanded state. This non-contact of the conductive structure 201 with the first, second, and third insulating layers 224, 226, 228 when in the expanded state reduces the likelihood of mechanical issues with respect to at least one of the first insulating layer 224, the second insulating layer 226, the third insulating layer 228, and the conductive structure 201.

Figure 7:
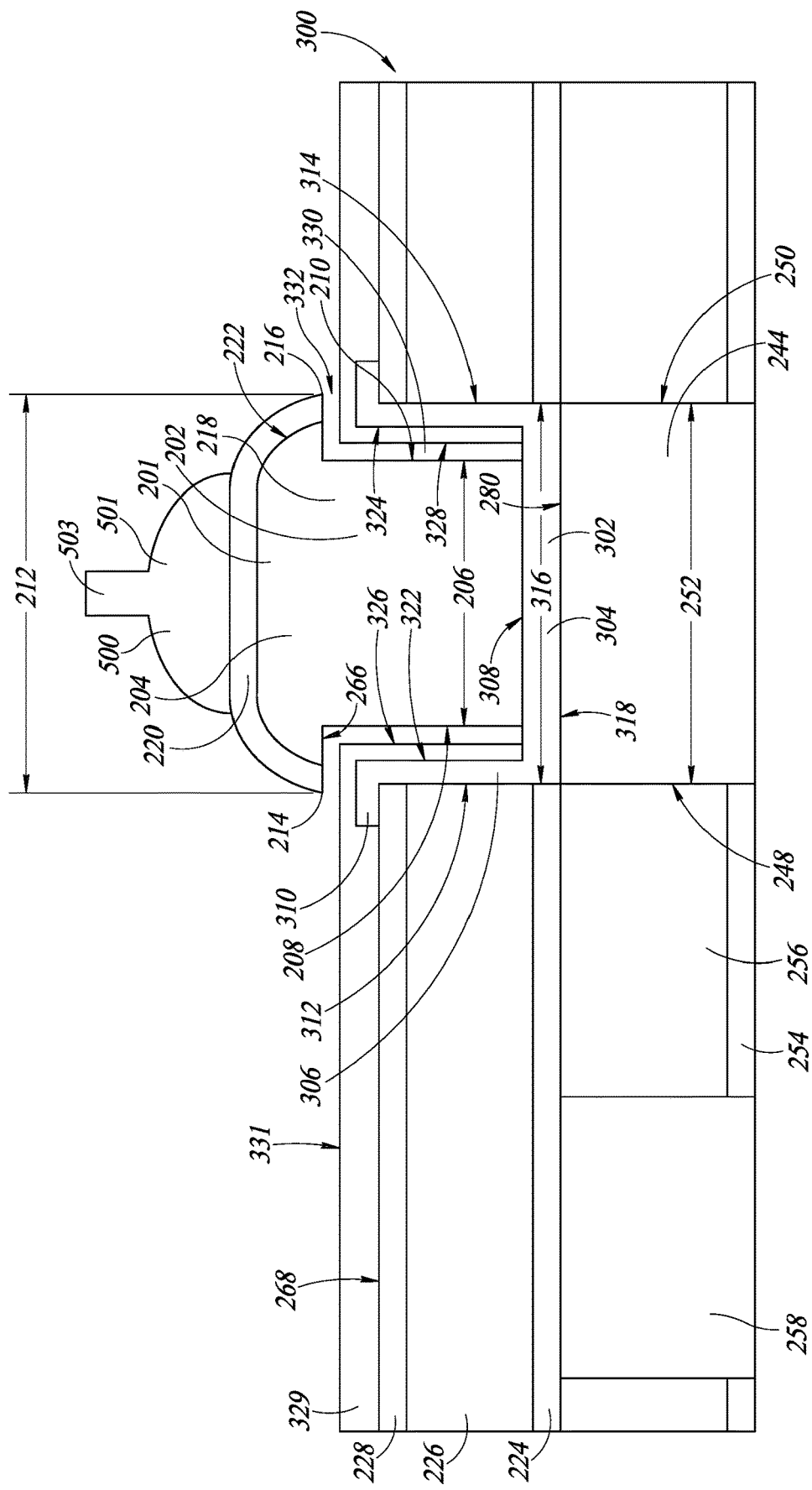
FIG. 7 is directed to a cross-sectional view of the alternative embodiment of the conductive structure as shown in FIGS. 3A and 3B coupled to a wire bond electrical connection.

FIG. 7 is a cross-sectional view of the structure 300 with the wire bond 500 coupled to the conductive structure 201. The ball 501 is on and coupled to the second conductive layer 220 of the conductive structure 201, and the ball 501 is on and coupled to the second portion 204 of the conductive structure 201. The wire 503 extends away from the ball 501 and may be coupled to another conductive feature (e.g., conductive pad, lead, etc.) spaced apart from the conductive structure 201 as shown in FIG. 7. In other words, the wire bond 500 is formed to form an electrical pathway or connection to the conductive feature spaced apart from the conductive structure 201 such that electrical signals may be transmitted to and from the conductive structure 201 along the wire bond 500. For example, the electrical signal may be a control signal, a data signal, an interrupt signal, or some other similar or like type of electrical signal that may be transmitted to or from the conductive structure 201 such that an electrical device may readily perform an electrical function.

Similar to how the crevice 260 provides clearance for expansion of the conductive structure 201 when forming the wire bond 500 on the conductive structure 201 as discussed above with respect to FIG. 6, the crevice 330 as shown in FIG. 7 provides clearance for expansion of the conductive structure 201 when forming the wire bond 500. Accordingly, for simplicity and brevity of the present disclosure, the clearance provided by the crevice 330 is not discussed further herein.

While not shown in FIGS. 6 and 7, a molding compound, epoxy, or resin may be formed to cover the conductive structure 201 and encase the wire bond 500 after the wire bond 500 has been formed to form a semiconductor device or package. The molding compound, epoxy, or resin (not shown) may be formed by a mold tool technique or some other molding compound formation technique. With respect to FIG. 6, when the mold tool technique is utilized to form the molding compound, epoxy, or resin (not shown), a mold is positioned on the second surface 268 of the third insulating layer 228 and the molding compound, epoxy, or resin is injected within the mold and is allowed to cure within the mold and on the second surface 268 forming the molding compound, epoxy, or resin on the second surface 268.

Figure 8:
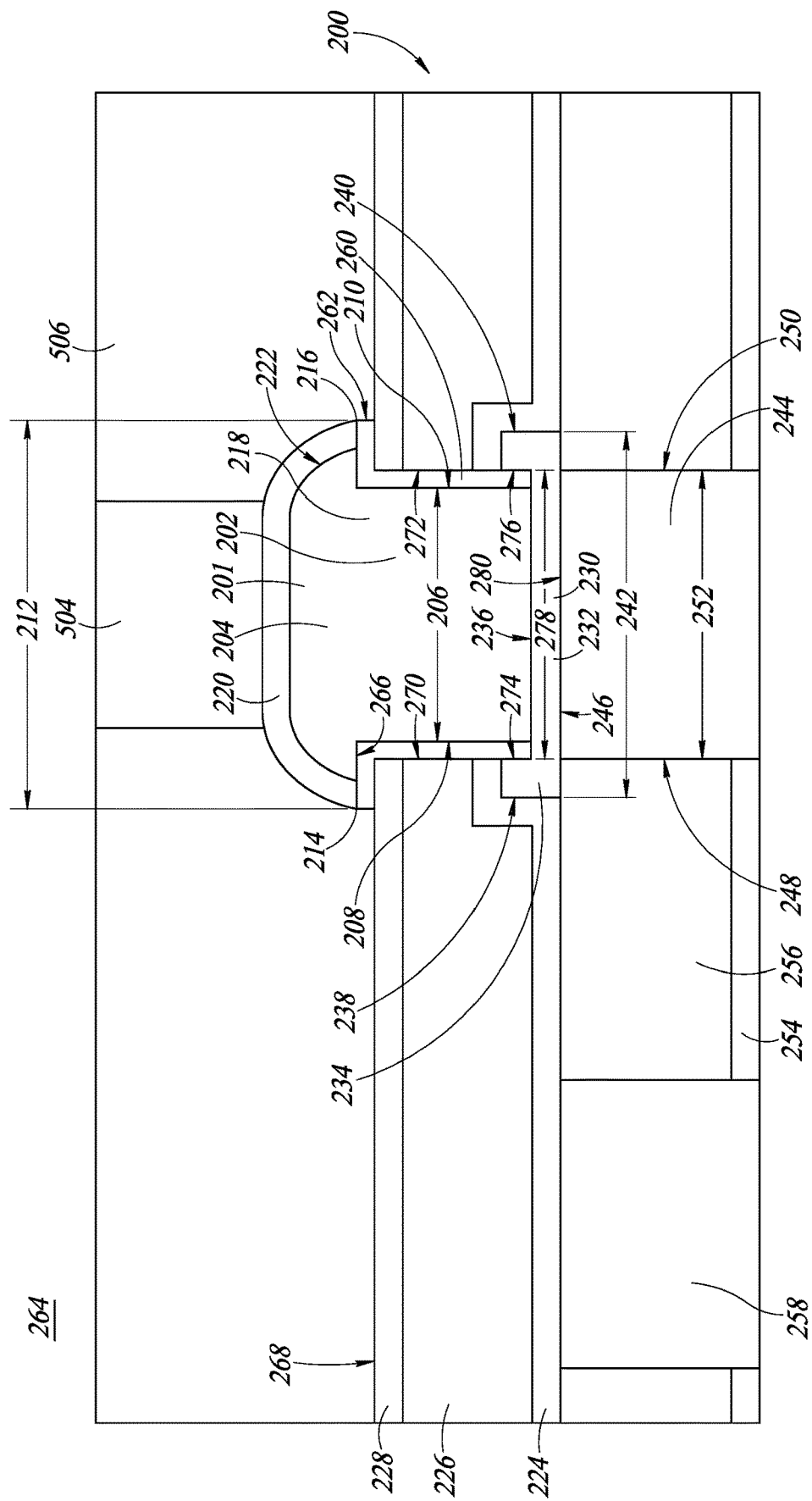
FIG. 8 is a cross-sectional view of the embodiment of the conductive structure as shown in FIGS. 2A and 2B coupled to an external contact of the semiconductor package.

FIG. 8 is a cross-sectional view that shows a contact structure 504, which may be referred to as another conductive structure, formed on and coupled to the conductive structure 201. The contact structure 504 is on the second portion 204 of the conductive structure 201 and is on the second conductive layer 220 of the conductive structure 201. The contact structure 504 extends through a molding compound, resin, or epoxy 506 to the conductive structure 201. The contact structure 504 is exposed from the molding compound, epoxy, or resin 506 such that the contact structure 504 may be utilized in mounting the structure 200 to an external electronic device (e.g., a controller, a printed circuit board (PCB), etc.). The molding compound, epoxy, or resin 506 is on the second conductive layer 220 and is on the second surface 268 of the third insulating layer 228. While in the embodiment as shown in FIG. 8, the crevice 260 is not filled by any of the molding compound, epoxy, or resin 506, in some alternative embodiments, at least some of the molding compound, epoxy or resin 506 may extend into the horizontal portion of the crevice 260 through the opening 262. In other words, in some alternative embodiments, the crevice 260 may be partially filled by the molding compound, epoxy, or resin 506.

When forming the molding compound, epoxy, or resin 506 and forming the contact structure 504 to be coupled to the conductive structure 201 as shown in FIG. 8, the conductive structure 201 may expand due to being exposed to an increase in temperature as well as a compression force when forming the molding compound, epoxy, or resin 506 and forming the contact structure 504. For example, a molding tool or stencil is positioned on the second surface 268 of the third insulating layer 208 and the molding compound, epoxy, or resin 506 is injected into the molding tool or stencil forming the molding compound, epoxy, or resin 506 between the second surface 268 of the third insulating layer 228 and the molding tool or stencil. The molding compound, epoxy, or resin 506 may then be allowed to cure before removing the molding tool or stencil from the second surface 268 of the third insulating layer 228. The molding compound, epoxy, or resin 506 may be cured by exposing the molding compound, epoxy, or resin 506 to an increase in temperature to harden the molding compound, epoxy, or resin 506 into a solid state before removing the molding tool or stencil. This increase in temperature to cure the molding compound, epoxy, or resin 506 may result in the conductive structure 201 expanding into the crevice 260.

After the molding compound, epoxy, or resin 506 is formed, a conductive material may be formed in an opening in the molding compound, epoxy, or resin 506 corresponding to the contact structure 504. For example, the contact structure 504 may be formed by filling the opening with the conductive material by an electroplating technique or an electroless process. For example, when an electroplating technique is utilized an electrical current may be passed through the conductive structure 201 to attract and adhere conductive material to the conductive structure 201 to form the contact structure 504 on and coupled to the conductive structure 201. This may increase the temperature of the conductive structure 201 and result in the conductive structure 201 expanding into the crevice 260.

These increases in temperature as discussed above when forming the molding compound, epoxy, or resin 506 may result in the conductive structure 201 expanding into the crevice 260 as shown in FIG. 8. In other words, the crevice 260 provides clearance such that as the conductive structure 201 expands the conductive structure 201 does not contact the first, second, and third insulating layers 224, 226, 228. If the conductive structure 201 were to physically contact and press against the first, second, and third insulating layers 224, 226, 228, the pressure applied by the expansion of the conductive structure 201 onto the first, second, and third insulating layers 224, 226, 228 may result in mechanical issues propagating with respect to at least one of the first insulating layer 224, the second insulating layer 226, and third insulating layer 228, and the conductive structure 201. However, since the crevice 260 is provided, the conductive structure 201 does not contact the first, second, and third insulating layers 224, 226, 228 even when the conductive structure 201 is in an expanded state. This non-contact of the conductive structure 201 with the first, second, and third insulating layers 224, 226, 228 when in the expanded state reduces the likelihood of mechanical issues at least with respect to the first insulating layer 224, the second insulating layer 226, the third insulating layer 228, and the conductive structure 201.

Figure 9:
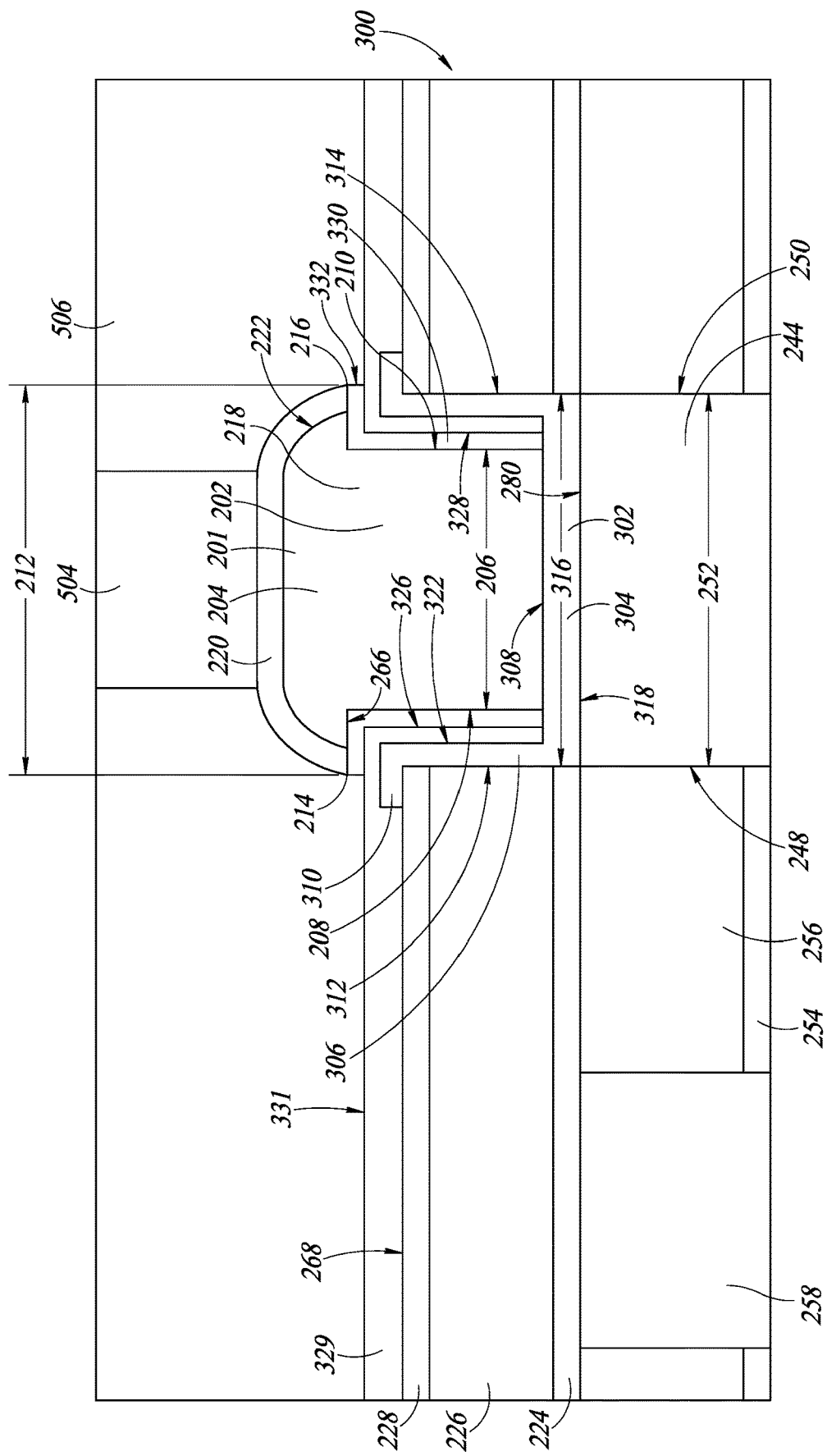
FIG. 9 is a cross-sectional view of the alternative embodiment of the conductive structure as shown in FIGS. 3A and 3B coupled to an external contact of the semiconductor package.

FIG. 9 is a cross-sectional view that shows the contact structure 504, which may be referred to as another conductive structure, formed on and coupled to the conductive structure 201. The contact structure 504 is on the second portion 204 of the conductive structure 201 and is on the second conductive layer 220 of the conductive structure 201. The contact structure 504 extends through the molding compound, epoxy, or resin 506 to the conductive structure 201. The contact structure 504 is exposed from the molding compound, epoxy, or resin 506 such that the contact structure 504 may be utilized in mounting the structure 200 to an external electronic device (e.g., a controller, a printed circuit board (PCB), etc.). The molding compound, epoxy, or resin 506 is on the second conductive layer 220 and is on the sixth insulating layer 329 of the third insulating layer 228. While in the embodiment as shown in FIG. 8, the crevice 330 is not filled by any of the molding compound, epoxy, or resin 506, in some alternative embodiments, at least some of the molding compound, epoxy, or resin 506 may extend into the horizontal portion of the crevice 330 through the opening 332.

Similar to how the crevice 260 provides clearance for expansion of the conductive structure 201 when forming the contact structure 504 on the conductive structure 201 and forming the molding compound, epoxy, or resin 506 on the second surface 268 of the third insulating layer 228 as discussed above with respect to FIG. 6, the crevice 330 as shown in FIG. 7 provides clearance for expansion of the conductive structure 201 when forming the contact structure 504 on the conductive structure 201 and forming the molding compound, epoxy, or resin 506 on the third surface 331 of the sixth insulating layer 329. Accordingly, for simplicity and brevity of the present disclosure, the clearance provided by the crevice 330 is not discussed further herein.

Figure 10:
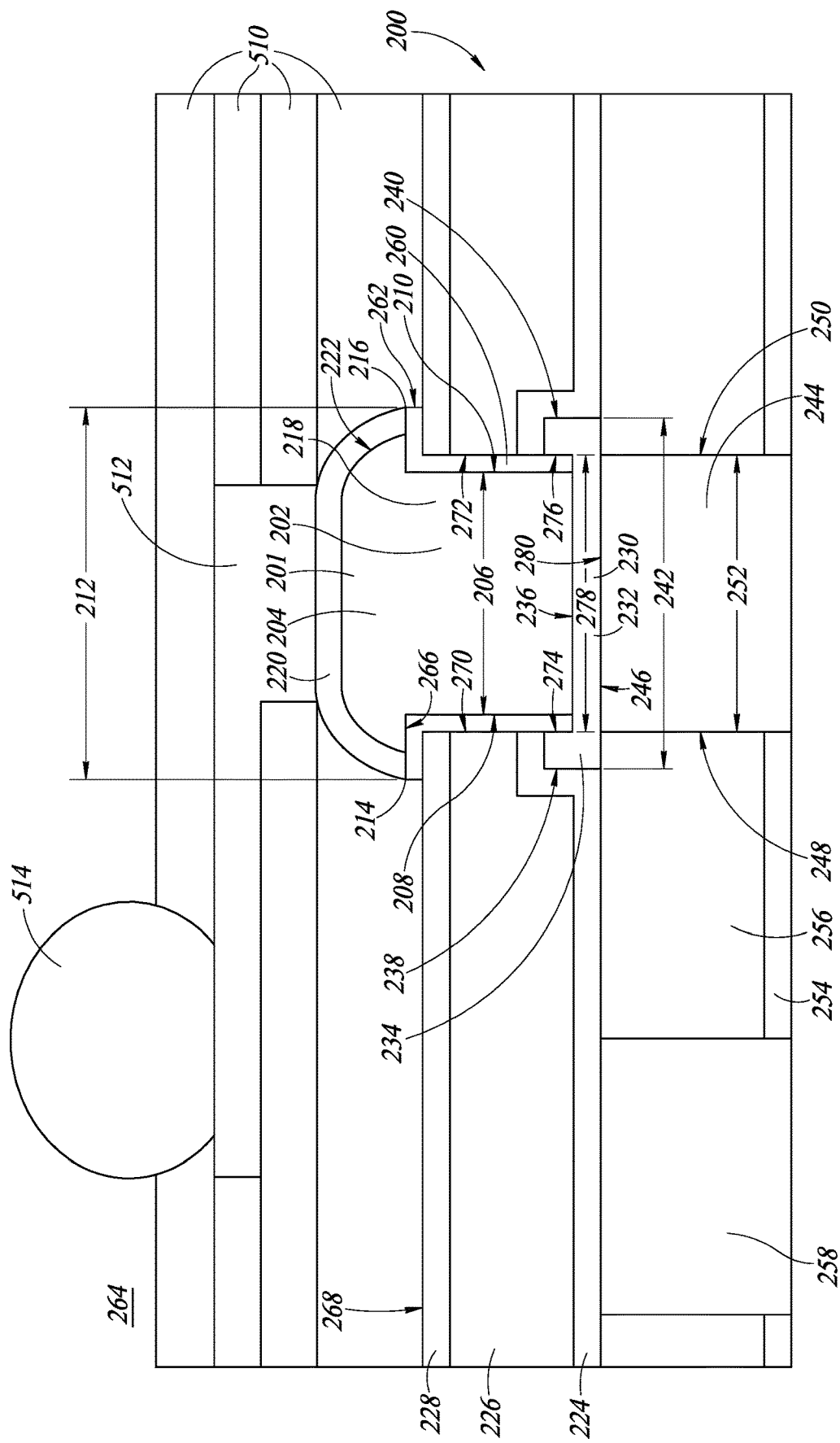
FIG. 10 is a cross-sectional view of the embodiment of the conductive structure as shown in FIGS. 2A and 2B coupled to a redistribution layer (RDL) the semiconductor package.

FIG. 10 is a cross-sectional view that shows a redistribution (RDL) layer 512 extending through a plurality of passivation layers 510 to a solder ball 514. The plurality of passivation layers 510 may be passivation layers that are formed in succession to form the RDL layer 512 that extends through the plurality of passivation layers 510. The solder ball extends into at least one of the plurality of passivation layers 510 to the RDL layer 512 and is coupled to the RDL layer 512. The solder ball 514 may be utilized to mount the structure 200 to an external electronic device (e.g., a controller, a printed circuit board (PCB), etc.).

Similar to forming the molding compound, epoxy, or resin 506 and the contact structure 504 as discussed with respect to FIG. 8, forming the plurality of the passivation layers 510 and the RDL layer 512 with many successive deposition steps that are carried out in succession to form the RDL layer 512 and the plurality of passivation layers 510 may result in the conductive structure 201 expanding into the crevice 260. Accordingly, for simplicity and brevity of the present disclosure, the formation of the expansion of the conductive structure 201 into the crevice 260 resulting from the formation of the plurality of passivation layers 510 and the RDL layer 512 is not discussed in further detail herein.

When forming the solder ball to be coupled to the RDL layer 512 through an opening in an uppermost one of the plurality of passivation layers 510 as shown in FIG. 10, a solder material may be formed in the opening in the uppermost one of the plurality of passivation layers 510 to couple the solder material to the RDL layer 512. The solder material may increase the temperature of the RDL layer 512, which may increase the temperature of the conductive structure 201. After the solder material is formed in the opening and is coupled to the RDL layer 512, a reflow process may be carried out such that the solder material is exposed to an increase in temperature to reflow the solder material into the solder ball 514 as shown in FIG. 10. Due to these temperature increases when forming the solder ball 514, the conductive structure 201 may expand into the crevice 260.

These increases in temperature as discussed above when forming the molding compound, epoxy, or resin 506 may result in the conductive structure 201 expanding into the crevice 260 as shown in FIG. 8. In other words, the crevice 260 provides clearance such that as the conductive structure 201 expands the conductive structure 201 does not contact the first, second, and third insulating layers 224, 226, 228. If the conductive structure 201 were to physically contact and press against the first, second, and third insulating layers 224, 226, 228, the pressure applied by the expansion of the conductive structure 201 onto the first, second, and third insulating layers 224, 226, 228 may result in the propagation of mechanical issues with respect to at least one of the first insulating layer 224, the second insulating layer 226, and third insulating layer 228, and the conductive structure 201. However, since the crevice 260 is provided, the conductive structure 201 does not contact the first, second, and third insulating layers 224, 226, 228 even when the conductive structure 201 is in an expanded state. This non-contact of the conductive structure 201 with the first, second, and third insulating layers 224, 226, 228 when in the expanded state reduces the likelihood of mechanical issues at least with respect to the first insulating layer 224, the second insulating layer 226, the third insulating layer 228, and the conductive structure 201.

Figure 11:
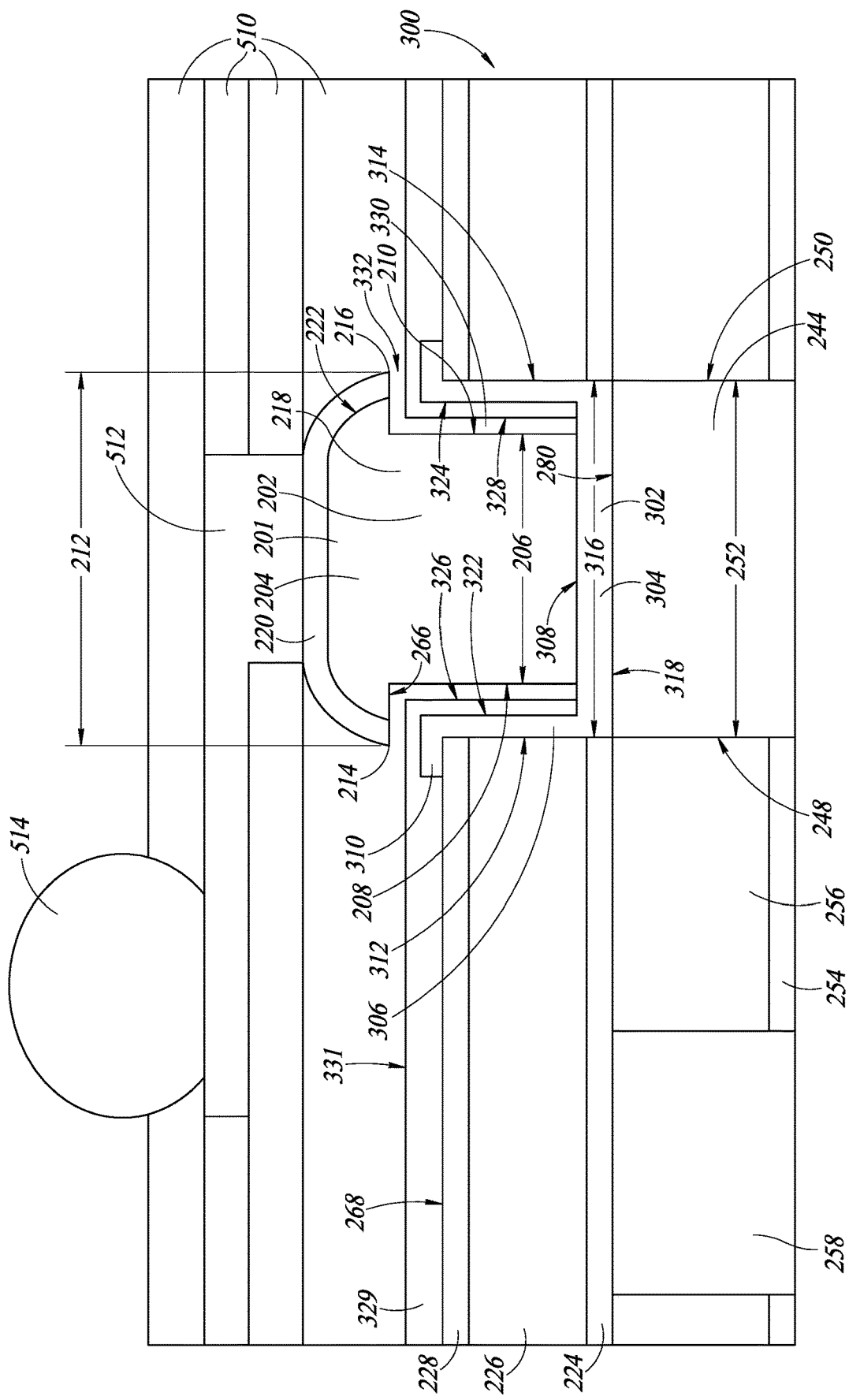
FIG. 11 is a cross-sectional view of the alternative embodiment of the conductive structure as shown in FIGS. 3A and 3B coupled to a redistribution layer (RDL) the semiconductor package.

FIG. 11 is a cross-sectional view that shows the redistribution (RDL) layer 512 extending through the plurality of passivation layers 510 to the solder ball 514. The plurality of passivation layers 510 may be passivation layers that are formed in succession to form the RDL layer 512 that extends through the plurality of passivation layers 510. The solder ball extends into at least one of the plurality of passivation layers 510 to the RDL layer 512 and is coupled to the RDL layer 512. The solder ball 514 may be utilized to mount the structure 200 to an external electronic device (e.g., a controller, a printed circuit board (PCB), etc.).

Similar to how the crevice 260 provides clearance for expansion of the conductive structure 201 when forming the plurality of passivation layers 510, the RDL layer 512, and the solder ball 514 as discussed above with respect to FIG.

10, the crevice 330 as shown in FIG. 11 provides clearance for expansion of the conductive structure 201 when forming the plurality of passivation layers 510, the RDL layer 512, and the solder ball 514 as shown in FIG. 11. Accordingly, for simplicity and brevity of the present disclosure, the clearance provided by the crevice 330 is not discussed further herein.

In FIGS. 7, 9, and 11 as discussed herein, the crevice 330 provides clearance such that the conductive structure 201 expands into the crevice 330 and does not come into physical contact or press against the sixth insulating layer 329 such that the likelihood of mechanical issues with respect to the first, second, third, and sixth insulating layers 224, 226, 228, 329 as well as the conductive structure 201 is reduced.

As shown in FIGS. 8, 9, 10, and 11, the respective crevices 260, 330 may be filled with air such that the respective crevice 260, 330 are air gaps. In other words, the respective crevices 260, 330 are not filled with the various materials and layers that are formed as shown in and discussed above with respect to FIGS. 8, 9, 10, and 11. The respective crevices 260, 330 may be gaps, spaces, or some other reference to the respective crevices that may be filled with a fluid or gas.

This reduction in the propagation of mechanical issues improves the overall EMG performance of the conductive structure 201 relative to if these mechanical issues occurred in or with respect to the conductive structure 201. For example, mechanical issues in or with respect to the conductive structure 201 generally result in electrons having a more difficult path or longer path to move along the conductive structure 201 which decreases the overall EMG performance of the conductive structure 201. Accordingly, reducing the likelihood of the propagation of mechanical issues by providing the crevices 260 adjacent to the conductive structure 201, provides clearance in the situation in which the conductive structure 201 expands due to a change in temperature allowing for the efficiency of the EMG performance of the conductive structure 201 to remain high relative to when mechanical issues occur in or with respect to the conductive structure 201.

FIG. 12 is a cross-sectional, enhanced, and zoomed in view of a portion of an alternative embodiment of the conductive structure 201 of the structure 200, which is similar to the cross-sectional, enhanced, and zoomed in view of the structure 200 as shown in FIG. 2B. However, unlike the embodiment of the structure 200 as shown in FIG. 2B, the alternative embodiment of the structure 200 as shown in FIG. 12 includes a seed layer 600 that is present on the recessed surface 236 and the third sidewall 274 of the barrier layer 230. While not shown, the seed layer 600 is also present on the fourth sidewall 276 of the barrier layer 230. The seed layer 600 may be made of a copper alloy, may be made of pure copper (Cu), may be made be made of aluminum copper (AlCu), or may be made of some other like or suitable conductive material for the seed layer 600. In some embodiments, when the seed layer 600 is made of aluminum copper, the aluminum copper may contain a small fraction of copper, which may be about and range from 0.5 to 2.0% by weight. The seed layer 600 is much thinner than the first thickness 282 of the barrier layer 230, which may be made of a titanium tungsten (TiW) material with or without copper or copper alloy dopants. Usually, when the seed layer 600 is stacked on the TiW material of the barrier layer 230, the TiW material is not doped with the copper dopants or copper alloy dopants.

The seed layer 600 may be formed after the step as shown in FIG. 4D and before the step as shown in FIG. 4E in the method of forming the structure 200 as shown in FIGS. 4A-4E of the present disclosure.

For example, in at least one embodiment, the seed layer 600 may be formed by dipping the partially formed structure or wafer as shown in FIG. 4D in a solution that contains copper (Cu+) ions. Dipping the partially formed structure as shown in FIG. 4D results in the copper solution entering the recess 410 and allows the copper ions to adhere to the recessed surface 236, the third sidewall 274, and the fourth sidewall 276 of the barrier layer 230 forming the seed layer 600 on the barrier layer 230. Once the seed layer 600 is formed, the seed layer 600, which is made of copper (Cu), a copper alloy, or some other suitable type of conductive material, is stacked on the barrier layer 230, which in this embodiment is made of TiW material that is not doped with copper, a copper alloy, or some other suitable type of conductive material dopant The stacked configuration of the barrier layer 230 and the seed layer 600 may readily be seen in FIG. 12. The first, second, and third insulating layers 224, 226, 228 may be made of materials to which the copper ions do not adhere such that the copper ions do not adhere to the respective sidewalls of the first, second, and third insulating layers 224, 226, 228 present at the sidewalls 270, 272, respectively. After this dipping step, which may occur after the step in FIG. 4D in at least one embodiment, the resist layer 408 is removed as shown in FIG. 4E and the conductive structure 201 is formed on the seed layer 600 through a conductive material or growing formation step (e.g., an electroless deposition technique), for example, in the fashion as discussed earlier herein with respect to FIG. 4E. However, the seed layer 600 may further facilitate or enable forming the conductive structure 201 on the seed layer 600 when utilizing an electroless deposition technique. For example, the first layer 202 of the conductive structure 201 may be made of nickel, which is attracted to the seed layer 600 when the seed layer 600 is a copper alloy, a pure copper (Cu), an aluminum copper (AlCu) material, or some other similar or like type of copper material or copper alloy material.

For example, in at least one alternative embodiment, the seed layer 600 is formed by utilizing a deposition technique (e.g., a physical vapor deposition technique (PVD), a chemical vapor deposition (CVD), or some other suitable or like type of deposition technique) to form the thin seed layer 600 as shown in FIG. 12. The deposition technique may be performed on the partially formed structure as shown in FIG. 4D such that the seed layer 600 is formed on the recessed surface 236, the third sidewall 274, and the fourth sidewall 276.

For example, in at least one alternative embodiment of forming the seed layer 600, when a physical vapor deposition (PVD) technique is utilized to form the seed layer 600 on recessed surface 236 of the barrier layer 230, which in this embodiment is made of the TiW material that is not doped with a copper or copper alloy material, the seed layer 600 is applied to be very thin relative to the barrier layer 230. As shown in FIG. 12, the barrier layer 230 is much thicker than the seed layer 600. The thinness of the seed layer 600 on the barrier layer 230 prevent any corrosion that may occur in the seed layer 600 due to contaminants entering through the opening 262 into the crevice 260 from passing through the barrier layer 230 and propagating or occurring in the first conductive layer 244. In other words, while the thin seed layer 600 further facilitates forming or growing of the conductive structure 201 on the barrier layer 230, the thicker barrier layer 230 acts as a barrier preventing any corrosion that may occur in the seed layer 600 from reaching the first conductive layer 244.

For example, in at least another alternative embodiment of forming the seed layer 600, when a physical vapor deposition (PVD) technique is utilized to form the seed layer on the recessed surface 236 of the barrier layer 230, which in this embodiment is made of the TiW material that is not doped with a copper or copper alloy material, the seed layer 600 is applied thicker than as shown in the FIG. 12. After the thicker seed layer 600 has been formed, an etching step is performed in which the thicker seed layer 600 is etched down to be the thin seed layer as shown in FIG. 12 such that the seed layer 600 is thinner than the barrier layer 230. After the etching step resulting in the thin seed layer 600, there remains a sufficient amounts or traces of copper material or copper alloy material present on the barrier layer 230 to further facilitate the forming or growing of the conductive structure 201 on the recessed surface 236 of the barrier layer 230 through an electroless deposition technique.

After this deposition step, which occurs after the step in FIG. 4D, the resist layer 408 is removed as shown in FIG. 4E and the conductive structure 201 is formed on the seed layer 600 through a conductive material or growing formation step (e.g., an electroless deposition technique) in the fashion as discussed earlier herein. However, the seed layer 600 may further facilitate or enable forming the conductive structure 201 on the seed layer 600.

FIG. 13 is a cross-sectional, enhanced, and zoomed in view of a portion of an alternative embodiment of the conductive structure 201 of the structure 300, which is similar to the cross-sectional, enhanced, and zoomed in view of the structure 300 as shown in FIG. 3B. However, unlike the embodiment of the structure 300 as shown in FIG. 3B, the alternative embodiment of the structure as shown in FIG. 13 includes a seed layer 602 that is present on the surface 308 of the barrier layer 302 and that is between the first sidewall 326 and the second sidewall 328. The seed layer 602 extends fully from the first sidewall 326 to the second sidewall 328. The seed layer 602 may be made of the same or similar materials as the seed layer 600 as discussed earlier within the present disclosure.

The seed layer 602 may be formed after the step as shown in FIG. 5D and before the step as shown in FIG. 5E in the method of forming the structure 300 as shown in FIGS. 5A-5E of the present disclosure.

For example, in at least one embodiment, the seed layer 602 may be formed by dipping the partially formed structure or wafer as shown in FIG. 5D in a solution that contains copper (Cu+) ions. Dipping the partially formed structure as shown in FIG. 5D results in the copper solution entering the recess and allows the copper ions to adhere to the surface 308 of the barrier layer 302 forming the seed layer 602 on the surface 308 of the barrier layer 302. Once the seed layer 602 is formed, the seed layer 602, which is made of copper, a copper alloy, or some other suitable type of conductive material, is stacked on the barrier layer 302, which in this embodiment is made of TiW material that is not doped with copper, a copper alloy, or some other suitable type of conductive material dopant. The stacked configuration of the barrier layer 302 and the seed layer 600 may readily be seen in FIG. 13. The sixth insulating layer 329 may be made of a material to which the copper ions do not adhere such that the copper ions do not adhere to the first and second sidewalls 326, 328 of the sixth insulating layer 329. After this dipping step, which occurs after the step in FIG. 5D, the conductive structure 201 is formed on the seed layer 602 through a conductive material or growing formation step (e.g., an electroless deposition technique) in the fashion as discussed earlier herein. However, the seed layer 602 may further facilitate or enable forming the conductive structure 201 on the seed layer 602 and the barrier layer 302 in the same or similar fashion as discussed earlier herein with respect to the seed layer 600 as shown in FIG. 12 further facilitates or enables forming of the first layer 202 of the conductive structure 201 on the barrier layer 230. Usually, when the seed layer 602 is stacked on the TiW material of the barrier layer 302, the TiW material is not doped with copper dopants or copper alloy dopants.

For example, in at least one alternative embodiment, the seed layer 602 is formed by utilizing a deposition technique (e.g., physical vapor deposition (PVD), chemical vapor deposition (CVD), or some other suitable or like type of deposition technique) to form the thin seed layer 602 as shown in FIG. 12. The deposition technique may be performed on the partially formed structure as shown in FIG. 5D such that the seed layer 602 is formed on the surface 308 of the barrier layer 302.

For example, in at least one alternative embodiment of forming the seed layer 602, when a physical vapor deposition (PVD) technique is utilized to form the seed layer 600 on the surface 308 of the barrier layer 302, which in this embodiment is made of the TiW material that is not doped with a copper or copper alloy material, the seed layer 602 is applied to be very thin relative to the barrier layer 302. As shown in FIG. 13, the barrier layer 302 is much thicker than the seed layer 602. The thinness of the seed layer 602 on the barrier layer 302 prevents any corrosion that may occur in the seed layer 602 due to contaminants entering through the opening 332 into the crevice 330 from passing through the barrier layer 302 and propagating or occurring in the first conductive layer 244. In other words, while the thin seed layer 602 further facilitates forming or growing of the conductive structure 201 on the barrier layer 302, the thicker barrier layer 302 acts as a barrier preventing any corrosion that may occur in the seed layer 602 from reaching the first conductive layer 244.

For example, in at least another alternative embodiment of forming the seed layer 602, when a physical vapor deposition (PVD) technique is utilized to form the seed layer 602 on the surface 308 of the barrier layer 302, which in this embodiment is made of the TiW material that is not doped with a copper or copper alloy material, the seed layer 602 is applied thicker than as shown in the FIG. 13. After the thicker seed layer 602 has been formed, an etching step is performed in which the thicker seed layer 602 is etched down to be the thin seed layer 602 as shown in FIG. 13 such that the seed layer 602 is thinner than the barrier layer 302. After the etching step resulting in the thin seed layer 602, there remains a sufficient amounts or traces of copper material or copper alloy material present on the barrier layer 302 to further facilitate or enable the forming or growing of the conductive structure 201 on the surface 308 of the barrier layer 302 through an electroless deposition technique.

After this deposition step, which occurs after the step in FIG. 4D, the conductive structure 201 is formed on the seed layer 602 through a conductive material or growing formation step in the fashion as discussed earlier herein. However, the seed layer 602 may further facilitate or enable forming the conductive structure 201 on the seed layer 602.

FIG. 14 is a cross-sectional, enhanced, and zoomed in view of a portion of an alternative embodiment of the conductive structure 201 of the structure 300, which is similar to the cross-sectional, enhanced, and zoomed in view of the structure 300 as shown in FIG. 3B. However, unlike the embodiment of the structure 300 as shown in FIG. 3B, the alternative embodiment of the structure as shown in FIG. 13 includes a seed layer 604 that is present on the surface 308, the third sidewall 322, and the fourth sidewall 324 of the barrier layer 302. The seed layer 604 is on a surface of the third portion 310 of the barrier layer 302 that faces away from the third insulating layer 228. The seed layer 604 may be made of the same or similar materials as the seed layer 600 as discussed earlier within the present disclosure.

The seed layer 604 may be formed before the barrier material is removed forming the barrier layer 302 as shown in FIG. 5B and after the step as shown in FIG. 5A in the method of forming the structure 300 as shown in FIGS. 5A-5E of the present disclosure.

For example, in at least one embodiment, the seed layer 604 may be formed by dipping the partially formed structure in which the barrier material still remains present along the second surface 268 as shown in FIG. 5B in a solution that contains copper (Cu+) ions. Dipping the partially formed structure as shown in FIG. 5B while the barrier material is present on the second surface 268 results in the copper solution entering the recess and allows the copper ions to adhere to the 308 of the barrier material forming the seed layer 604 along the barrier material. Once the seed layer 604 is formed, the see layer 604, which is made of copper (Cu), a copper alloy, or some other suitable type of conductive material, is stacked on the barrier layer 302, which in this embodiment is made of TiW material that is not doped with copper, a coper alloy, or some other suitable type of conductive material dopant. The stacked configuration of the barrier layer 302 and the seed layer 604 may readily be seen in FIG. 14. After this dipping step, which occurs before removing the barrier material from the surface 268 to form the barrier layer 302 as shown in FIG. 5B, the barrier material and the seed layer 604, which is present on the barrier material, is removed from the surface 268 to form the barrier layer 302 as shown in FIG. 5B with the seed layer 604 present on the barrier layer as shown in FIG. 14. After the seed layer 604 and the barrier layer 302 has been formed, the steps of FIGS. 5C-5E such that the structure as shown in FIG. 14 is formed.

For example, in at least one alternative embodiment, the seed layer 602 is formed by utilizing a deposition technique (e.g., physical vapor deposition (PVD), chemical vapor deposition (CVD), or some other suitable or like type of deposition technique) to form the thin seed layer 604 as shown in FIG. 12. The deposition technique may be performed on the barrier material before the barrier material is removed from the surface 268 as shown in FIG. 5B such that the seed layer 604 is formed on the barrier material and is then patterned along with the barrier material to form the seed layer on the barrier layer 302. After this deposition step, which occurs after the step in FIG. 4D. However, the seed layer 602 may further facilitate or enable forming the conductive structure 201 on the seed layer 602.

For example, in at least one alternative embodiment of forming the seed layer 604, when a physical vapor deposition (PVD) technique is utilized to form the seed layer 600 on the barrier layer 302, which in this embodiment is made of the TiW material that is not doped with a copper or copper alloy material, the seed layer 604 is applied to be very thin relative to the barrier layer 302. As shown in FIG. 14, the barrier layer 302 is much thicker than the seed layer 604. The thinness of the seed layer 604 on the barrier layer 302 prevents any corrosion that may occur in the seed layer 604 due to contaminants entering through the opening 332 into the crevice 330 from passing through the barrier layer 302 and propagating or occurring in the first conductive layer 244. In other words, while the thin seed layer 604 further facilitates forming or growing of the conductive structure 201 on the barrier layer 302, the thicker barrier layer 302 acts as a barrier preventing any corrosion that may occur in the seed layer 604 from reaching the first conductive layer 244.

For example, in at least another alternative embodiment of forming the seed layer 604, when a physical vapor deposition (PVD) technique is utilized to form the seed layer on the barrier layer 302, which in this embodiment is made of the TiW material that is not doped with a copper or copper alloy material, the seed layer 604 is applied thicker than as shown in the FIG. 14. After the thicker seed layer 604 has been formed, an etching step is performed in which the thicker seed layer 604 is etched down to be the thin seed layer 604 as shown in FIG. 14 such that the seed layer 604 is thinner than the barrier layer 302. After the etching step resulting in the thin seed layer 604, there remains a sufficient amounts or traces of copper material or copper alloy material present on the barrier layer 302 to further facilitate the forming or growing of the conductive structure 201 on the recessed surface 236 of the barrier layer 230 through an electroless deposition technique.

As discussed earlier herein, the seed layer 604 may be formed to further facilitate or enable forming the conductive structure 201 on the barrier layer 302.

While the seed layers 600, 602, 604 as shown in FIGS. 12, 13, and 14 may allow for the conductive structure 201 to be more readily formed on the barrier layers 230, 302, respectively, due to the presence of the seed layers 600, 602, 604, respectively, the seed layers 600, 602, 604, which may be made of a copper material (e.g., pure copper (Cu), aluminum coper (AlCu), etc.), are more susceptible to corrosion when exposed to contaminants that may pass through the crevices 260, 330, respectively. However, as the seed layers 600, 602, 604, respectively, are much thinner than the barrier layers 230, 302, respectively, resulting in any corrosion that may occur in the thin seed layer 600, 602, 604 not being capable of reaching the first conductive layer 244 as the barrier layers 230, 302, respectively, protect the first conductive layer 244. In other words, the seed layers 600, 602, 604 being thin along with the barrier layers 230, 302 prevents corrosion from reaching the first conductive layer 244 while facilitating forming the conductive structure 201 on the barrier layers 230, 302, respectively. In other words, the seed layers 600, 602, 604 being substantially thinner than the barrier layers 230, 302 allows for further facilitating the conductive structure 201 on the barrier layer 230, 302 while also preventing any corrosion that occurs in the seed layers 600, 602, 604, which may be due to contaminants, from reaching the first conductive layer 244 (e.g., the barrier layers 230, 302 prevent or block the contaminants or corrosion from reaching the first conductive layer 244) such that corrosion does not occur in the first conductive layer 244.

The seed layers 600, 602, 604 as discussed with respect to FIGS. 12-14 of the present disclosure may have a thickness of a few nanometers (nm) to a few hundred nanometers (nm). The thickness to which the seed layer 600, 602, 604 is formed may depend on the thickness of the barrier layer 230.

In view of the above discussion herein, providing the barrier layers 230, 302 as shown in FIGS. 2A, 3A, 12, 13, and 14 reduces the likelihood of the conductive layer 244 being corroded or damaged by the moisture, contaminants, and debris from within the external environment 264 as the barrier layers 230, 302 prevent, block, and stop the moisture, contaminants, and debris from reaching the conductive layer 244. This maintains the EMG performance of the conductive layer 244 higher than if the conductive layer 244 were corroded or damaged by the moisture, contaminants, and debris from the external environment 264.

A device may be summarized as including a conductive damascene layer having a first surface; a conductive barrier layer on the conductive damascene layer, the conductive barrier layer is coupled to the conductive damascene layer, the conductive barrier layer having a second surface that faces away from the first surface; at least one insulating layer on the conductive barrier layer, the at least one insulating layer including a first sidewall that extends from the conductive barrier layer, the first sidewall is transverse to the first surface and the second surface; a conductive structure coupled to the conductive barrier layer, the conductive structure is separated from the conductive damascene layer by the conductive barrier layer, the conductive structure including a first portion extending from the second surface of the conductive barrier layer in a first direction, a second portion on the first portion and extending in a second direction transverse to the first direction, and a second sidewall extending along the first portion from the second surface of the conductive barrier layer; and a crevice is between the first sidewall and the second sidewall, extends along the first sidewall and the second sidewall, and separates the first sidewall from the second sidewall.

The crevice may extend to the second surface of the conductive barrier layer, and the crevice may be separated from the first surface of the conductive damascene layer by the conductive barrier layer.

The conductive barrier layer may include a recessed central portion that includes the second surface of the conductive barrier layer; and a raised peripheral portion that extends around the recessed central portion and is raised relative to the recessed central portion.

The at least one insulating layer may be on the raised peripheral portion, and the first sidewall may extend from the raised peripheral portion of the conductive barrier layer.

The conductive barrier layer may include a first portion on the first surface of the conductive damascene layer; a second portion at a first end of the first portion, the second portion extending from the first edge of the first portion and being transverse to the first portion; and a third portion extending from a second end of the second portion, the third portion being transverse to the second portion.

The at least one insulating layer may cover the first portion and the second portion of the conductive barrier layer, the at least one insulating layer may extend from third portion along the second portion to the first portion, and the first sidewall of the at least one insulating layer may be on and extend from the second surface of the conductive barrier layer.

The crevice may be separated from the second portion and the third portion of the conductive barrier layer by the at least one insulating layer.

The first portion of the conductive structure may include a first dimension extending in the second direction; and the second portion of the conductive structure may include a second dimension extending in the second direction, the second dimension being greater than the first dimension.

The crevice may extend from the conductive barrier layer along the first sidewall and the second sidewall to a third surface of the second portion of the conductive structure, the third surface being transverse to the first and second sidewalls.

The crevice may extend along the third surface to an edge of the second portion of the conductive structure.

The at least one insulating layer may include a fourth surface transverse from the second sidewall and may extend from the second sidewall away from the conductive structure, and the crevice may be between the third surface and the fourth surface.

A device may be summarized as including a conductive layer having a first surface; a conductive barrier layer on the conductive layer, the conductive barrier layer is coupled to the conductive layer, the conductive barrier layer including a first end and a second end opposite to the first end; a first insulating layer on the conductive barrier layer, the first insulating layer including a first sidewall and covering the first end and the second end of the conductive barrier layer; a conductive structure coupled to the conductive barrier layer; and an air gap extends along the first sidewall and the conductive structure, the air gap is between the first sidewall and the conductive structure.

The device may further include a wire bond coupled to the conductive structure.

The device may further include a molding compound overlapping the conductive structure, the molding compound including a second surface facing away from the first surface; and a conductive contact pad in the molding compound, the conductive contact pad is coupled to the conductive structure and is exposed from the second surface of the molding compound.

The device may further include a second insulating layer on the first insulating layer; a redistribution layer extending through the second insulating layer, the redistribution layer coupled to the conductive structure; and a solder ball is coupled to the redistribution layer and is exposed from the second insulating layer.

A method may be summarized as including forming a conductive barrier layer on a first surface of a conductive damascene layer; forming at least one insulating layer on the conductive barrier layer to cover a first end of the conductive barrier layer and cover a second end of the conductive barrier layer opposite to the first end; forming an opening in the insulating layer exposing the conductive barrier layer from the at least one insulating layer; and forming a conductive structure in the opening, on the conductive barrier layer, and separated from the conductive damascene layer by the conductive barrier layer, forming the conductive structure includes forming a gap between the conductive structure and the at least one insulating layer and with an end that is on the conductive barrier layer.

The method may further include coupling the wire bond to the conductive structure.

The method may further include forming an insulating material on the conductive structure; forming an opening in the insulating material exposing the conductive structure; and forming a conductive material in the opening coupling the conductive material to the conductive structure.

Forming the conductive material may form a conductive pad coupled to the conductive structure.

Forming the conductive material may form a redistribution layer coupled to the conductive structure.

The various embodiments described above can be combined to provide further embodiments.

Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a conductive damascene layer having a first surface;
a conductive barrier layer on the conductive damascene layer, the conductive barrier layer is coupled to the conductive damascene layer, the conductive barrier layer having a second surface that faces away from the first surface, the conductive barrier layer including:
a first portion on the first surface of the conductive damascene layer;
a second portion at a first end of the first portion, the second portion extends from a first edge of the first portion and is transverse to the first portion; and
a third portion extends from a second end of the second portion, the third portion is transverse to the second portion, and the third portion terminates at a third end;
at least one insulating layer on the conductive barrier layer, the at least one insulating layer including a first sidewall that extends from the conductive barrier layer, the first sidewall is transverse to the first surface and the second surface;
a conductive structure over the conductive barrier layer, the conductive structure is separated from the conductive damascene layer by the conductive barrier layer, the conductive structure including:
a first portion extending away from the second surface of the conductive barrier layer in a first direction;
a second portion on the first portion and extending in a second direction transverse to the first direction, the second portion extends over the first portion, the second portion, and the third portion of the conductive barrier layer, and the second portion terminates before reaching the third end of the third portion; and
a second sidewall extending along the first portion from the second surface of the conductive barrier layer;
a crevice being between the first sidewall and the second sidewall, being between the second portion of the conductive structure and the third portion of the conductive barrier region, extending along the first sidewall and the second sidewall, and separating the first sidewall from the second sidewall and separating the second portion of the conductive structure from the third portion of the conductive barrier layer.

2. The device of claim 1, wherein the crevice is separated from the first surface of the conductive damascene layer by the conductive barrier layer.

3. The device of claim 1, wherein:
the first portion of the conductive barrier layer is a recessed central portion that includes the second surface of the conductive barrier layer; and
the second portion and the third portion define a raised peripheral portion that extends around the recessed central portion and is raised relative to the recessed central portion.

4. The device of claim 3, wherein the at least one insulating layer is on the raised peripheral portion.

5. The device of claim 1, wherein the at least one insulating layer entirely covers the first portion and the second portion of the conductive barrier layer, the at least one insulating layer extends from the third portion along the second portion to the first portion.

6. The device of claim 1, wherein:
the first portion of the conductive structure includes a first dimension extending in the second direction; and
the second portion of the conductive structure includes a second dimension extending in the second direction, the second dimension being greater than the first dimension.

7. The device of claim 1, wherein the crevice extends along the first sidewall and the second sidewall to a third surface of the second portion of the conductive structure, the third surface is transverse to the first and second sidewalls.

8. The device of claim 7, wherein the crevice extends along the third surface to an edge of the second portion of the conductive structure.

9. The device of claim 8, wherein the at least one insulating layer includes a fourth surface transverse from the second sidewall and extends from the second sidewall away from the conductive structure, and the crevice is between the third surface and the fourth surface.

10. The device of claim 1, further comprising a conductive layer on the second surface of the conductive barrier layer.

11. The device of claim 10, wherein the conductive layer is extended from the second surface of the conductive barrier layer to the first portion of the conductive structure.

12. The device of claim 8, wherein the second portion of the conductive structure terminates at the edge, and the edge overlies the third portion of the conductive barrier layer.

13. The device of claim 1, wherein:
the first portion of the conductive structure is made of a first conductive material; and
the second portion of the conductive structure is made of the first conductive material and a second conductive material stacked on the first conductive material.

14. A device, comprising:
a conductive layer having a first surface;
a conductive barrier layer on the conductive layer, the conductive barrier layer is coupled to the conductive layer, the conductive barrier layer including:
a first portion on the conductive layer, the first portion having a first edge;
a second portion on the first portion and extending outward from the first edge of the first portion, the second portion being transverse to the first portion; and
a third portion extending outward from the second portion, the third portion spaced apart from the first portion by the second portion, the third portion being transverse to the second portion, and the third portion terminating at an end;
a seed layer on and covering the first portion, the second portion, and the third portion of the conductive barrier layer;
an insulating layer on the seed layer, the insulating layer covering the second portion and the third portion of the conductive barrier layer, and the insulating layer partially covering the first portion of the conductive barrier layer, the first insulating layer covering the first edge and the end of the conductive barrier layer, and the insulating layer including:
a second surface that faces away from the third portion of the conductive barrier layer; and
a first sidewall that faces away from the second portion, that is transverse to the second surface, and that extends from the second surface to the first portion of the conductive barrier layer;

a conductive structure that is over the conductive barrier layer, the conductive structure including a first portion that extends to the first surface of the conductive layer in a first direction and a second portion that extends outward from the first portion in a second direction transverse to the first direction, the second portion overlaps the first portion, the second portion, and the third portion of the conductive barrier layer, and the second portion of the conductive structure terminates before reaching the end of the third portion of the conductive barrier layer; and a crevice including;
   a first crevice portion that extends along and between the first sidewall and the first portion of the conductive structure; and
   a second crevice portion that extends along and between the second surface of the insulating layer and the second portion of the conductive structure, and the second crevice portion is transverse to the first crevice portion.

15. The device of claim 14, further comprising a redistribution layer coupled to the conductive structure.

16. The device of claim 14, further comprising:
a molding compound overlapping the conductive structure, the molding compound including a second surface facing away from the first surface.

17. The device of claim 14, further comprising:
a second insulating layer on the first insulating layer;
a redistribution layer extending through the second insulating layer, the redistribution layer coupled to the conductive structure; and
a solder ball is coupled to the redistribution layer and is exposed from the second insulating layer.

18. The device of claim 14, further comprising a conductive seed layer on the conductive barrier layer, and wherein:
the conductive barrier layer is on the conductive seed layer; and
the conductive seed layer extends from the conductive barrier layer to the conductive structure and separates the conductive structure from the conductive barrier layer.

19. A device, comprising:
a conductive layer having a first surface;
a conductive barrier layer on the conductive layer, the conductive barrier layer includes:
   a first portion coupled to and on the conductive layer, the first portion includes a first surface that faces away from the conductive layer;
   a second portion that is transverse from the first portion, the second portion extends outward from the first portion, the second portion including a first sidewall that is transverse to the first surface and extends outward from the first surface; and
   a third portion that is transverse to the second portion and parallel to the first portion, the third portion extends outward from the second portion and terminates at an end;
at least one insulating layer overlapping first portion, the second portion, and the third portion of the conductive barrier layer, the at least one insulating layer including a second sidewall transverse to the first surface of the first portion and a second surface transverse to the second sidewall and facing away from the third portion of the conductive barrier layer;
a conductive structure including:
   a first portion on the first portion of the conductive barrier layer and extending away from the conductive barrier layer; and
   a second portion that is transverse to the first portion, that extends outward from the first portion, and that overlaps the at least one insulating layer;
a crevice that extends along and between the second sidewall and the first portion of the conductive structure and that extends along and between the second surface of the at least one insulating layer and the second portion of the conductive structure.

20. The device of claim 19, further comprising a conductive seed layer on the first portion and the second portion of the conductive barrier layer, and the conductive seed layer covers the first sidewall of the second portion of the conductive barrier layer.

* * * * *